United States Patent
Miyakoshi et al.

(10) Patent No.: US 9,196,722 B2
(45) Date of Patent: Nov. 24, 2015

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Tokyo (JP)

(72) Inventors: Nobuki Miyakoshi, Hanno (JP); Masanori Fukui, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 14/257,451

(22) Filed: Apr. 21, 2014

(65) Prior Publication Data
US 2014/0312416 A1    Oct. 23, 2014

(30) Foreign Application Priority Data
Apr. 22, 2013   (JP) .................. 2013-089799

(51) Int. Cl.
*H01L 29/78*    (2006.01)
*H01L 29/49*    (2006.01)
*H01L 27/02*    (2006.01)

(52) U.S. Cl.
CPC ........ *H01L 29/7817* (2013.01); *H01L 27/0288* (2013.01); *H01L 29/4916* (2013.01)

(58) Field of Classification Search
CPC ............ H01L 29/7817; H01L 29/4916; H01L 27/0288
See application file for complete search history.

(56) References Cited

FOREIGN PATENT DOCUMENTS

JP    2011134984 A    7/2011

*Primary Examiner* — Long Pham
(74) *Attorney, Agent, or Firm* — Hauptman Ham, LLP

(57) ABSTRACT

A semiconductor device includes, in a cell region thereof: a low resistance semiconductor layer; a drift layer; a base region; a high-concentration semiconductor region; and a gate electrode layer. The semiconductor device includes, in a peripheral region thereof: the low resistance semiconductor layer; the drift layer; which is formed over the low resistance semiconductor layer; a gate lead line; a gate finger; and a gate pad. The gate electrode layer and the gate lead line are electrically connected with each other by way of a resistor made of polysilicon containing an impurity, and an impurity concentration in polysilicon which forms the resistor is lower than an impurity concentration in polysilicon which forms the gate electrode layer.

15 Claims, 17 Drawing Sheets cross section taken along x-x cross section taken along y-y cross section taken along x-x cross section taken along y-y cross section taken along x-x cross section taken along y-y cross section taken along x-x
cross section taken along y-y
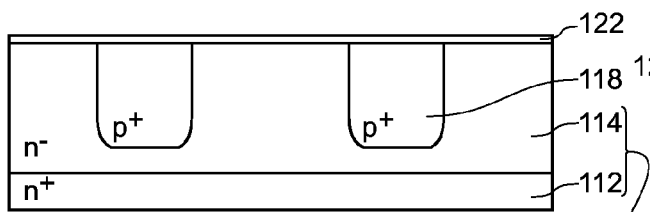
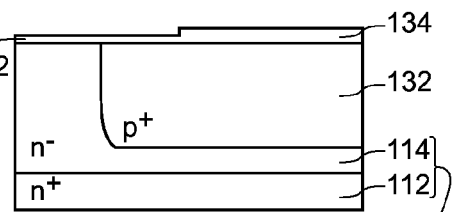
FIG.4A-1
FIG.4A-2
cross section taken along x-x
cross section taken along y-y
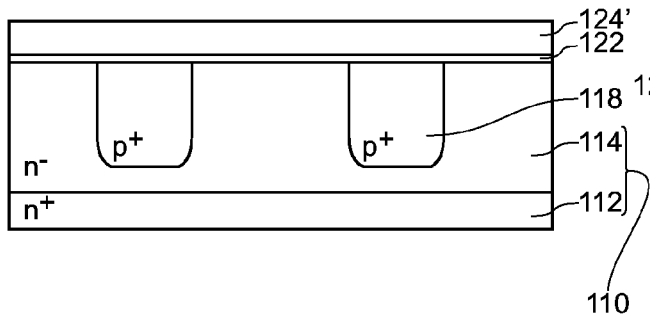
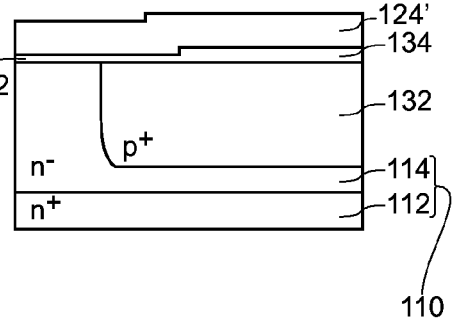
FIG.4B-1
FIG.4B-2
cross section taken along x-x
n-type impurity
cross section taken along y-y
n-type impurity
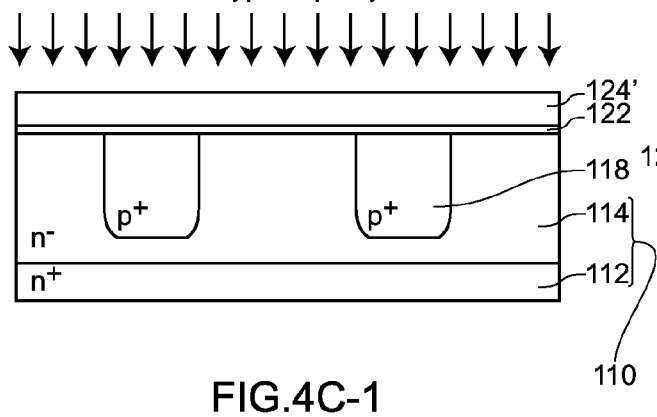
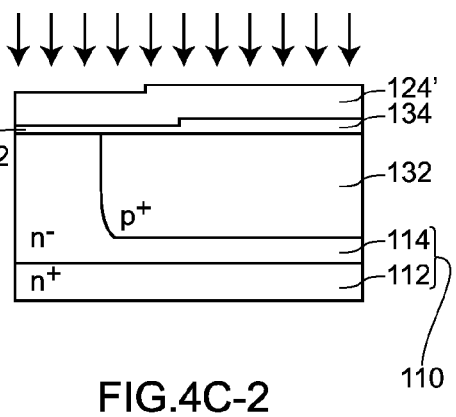
FIG.4C-1
FIG.4C-2 cross section taken along x-x    cross section taken along y-y
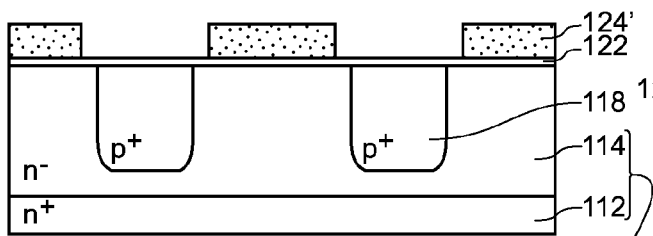
FIG.5A-1                         FIG.5A-2
cross section taken along x-x    cross section taken along y-y
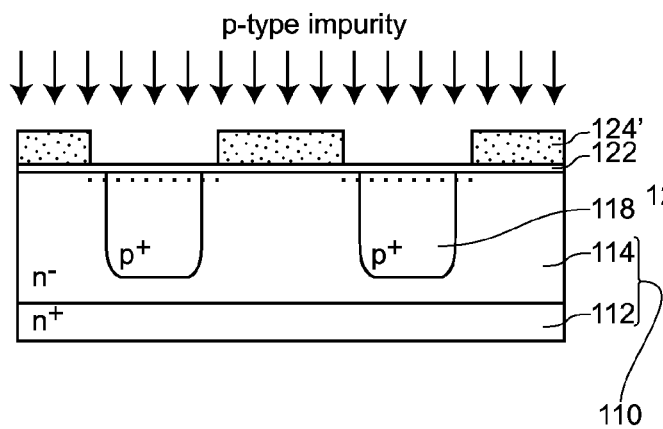
FIG.5B-1                         FIG.5B-2
cross section taken along x-x    cross section taken along y-y
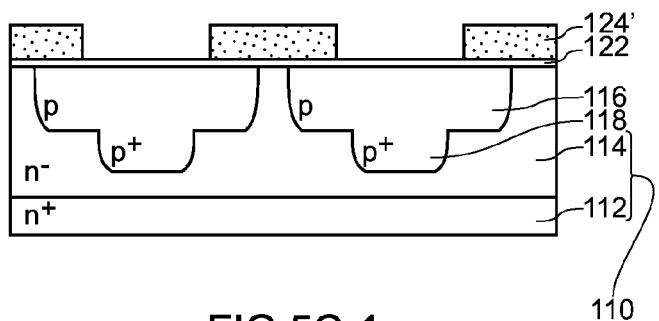
FIG.5C-1                         FIG.5C-2 cross section taken along x-x cross section taken along y-y cross section taken along x-x cross section taken along y-y cross section taken along x-x cross section taken along y-y cross section taken along x-x cross section taken along y-y cross section taken along x-x cross section taken along y-y

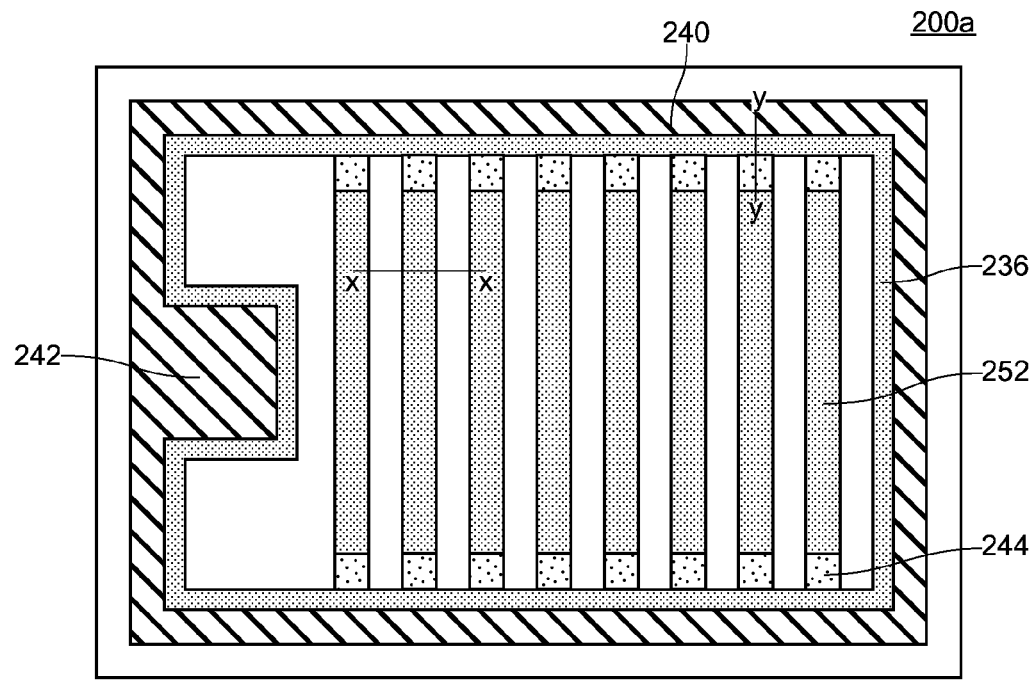
FIG.18A
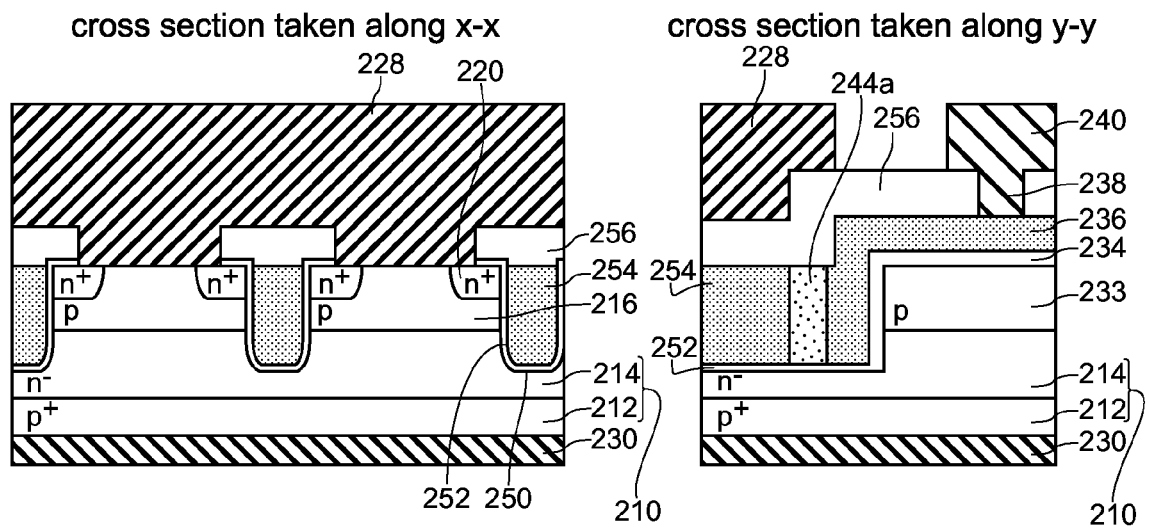
cross section taken along x-x
FIG.18B
cross section taken along y-y
FIG.18C

SEMICONDUCTOR DEVICE AND METHOD OF MANUFACTURING SEMICONDUCTOR DEVICE

BACKGROUND OF THE INVENTION

1. Field of the Invention

The present invention relates to a semiconductor device and a method of manufacturing a semiconductor device.

2. Description of the Related Art

Conventionally, there has been known a semiconductor device where noises generated by high-speed switching (for example, radio noises) can be decreased (see JP-A-2011-134984 (patent literature 1, for example).

FIG. 20A to FIG. 20C are views for explaining a conventional semiconductor device 900. FIG. 20A is a plan view of the semiconductor device 900, FIG. 20B is a cross-sectional view taken along a line x-x in FIG. 20A, and FIG. 20C is an enlarged view of an essential part of a region surrounded by a broken line A in FIG. 20A. In FIG. 20A to FIG. 20C, symbol 926 indicates an interlayer insulation layer, and symbol 928 indicates a source electrode layer. In FIG. 20A and FIG. 20C, the interlayer insulation layer 926 and the source electrode layer 928 are not shown.

The conventional semiconductor device 900 is, as shown in FIG. 20A to FIG. 20C, a MOSFET which includes: a cell region which is defined on a semiconductor substrate on which an $n^+$ type low-resistance semiconductor layer (not shown in the drawing) and an $n^-$ type drift layer 914 are laminated; and a peripheral region which includes a gate finger forming region which surrounds the cell region and a gate pad forming region which projects into the cell region.

The semiconductor device 900 includes, in the cell region: the low resistance semiconductor layer; the $n^-$ type drift layer 914 formed over the low resistance semiconductor layer; a p-type base region 916 formed over a surface of the drift layer 914; an n-type high-concentration semiconductor region 920 formed over a surface of the base region 916; a gate electrode layer made of polysilicon and formed over the base region 916 sandwiched between the drift layer 914 and the high-concentration semiconductor region 920 by way of a gate insulation layer 922. The semiconductor device 900 includes a plurality of gate electrode layers 924 formed in a stripe shape as the gate electrode layer.

The semiconductor device 900 includes, in the peripheral region: the low resistance semiconductor layer (not shown in the drawing); the drift layer 914 formed over the low resistance semiconductor layer; gate lead lines (not shown in the drawing) made of polysilicon, formed over the drift layer 914 by way of a field oxide film (not shown in the drawing), and formed in a gate finger forming region and a gate pad forming region; a gate finger 940 made of metal and formed over the gate lead lines in the gate finger forming region; and a gate pad 942 made of metal, formed over the gate lead lines in the gate pad forming region, and connected to the gate finger 940.

In the semiconductor device 900, the gate electrode layers 924 and the gate lead lines are electrically connected to each other by way of a resistor 944 made of polysilicon containing an impurity. An impurity concentration in polysilicon which forms the resistor 944 is equal to an impurity concentration in polysilicon which forms the gate electrode layers 924, and a width of the resistor 944 is narrower than a width of the gate electrode layer 924. Since the width of the resistor 944 is narrower than the width of the gate electrode layer 924, an internal resistance of the resistor 944 becomes higher than an internal resistance of the gate electrode 924.

According to the conventional semiconductor device 900, the gate electrode layers 924 and the gate finger 940 are electrically connected to each other by way of the resistors 944 and hence, a falling of an electric current at the time of turning off the semiconductor device 900 can be made gentle by increasing a charge/discharge time constant of the gate. Accordingly, dv/dt at an overshoot portion of a voltage becomes small at the time of turning off the semiconductor device 900 whereby noises generated due to high-speed switching can be decreased.

SUMMARY OF THE INVENTION

However, in the conventional semiconductor device 900, in forming the resistors 944 in steps of manufacturing the semiconductor device, there is a case where it is difficult to manufacture the resistors 944 having a narrower width than the gate electrode layers 924 with high accuracy so that irregularities occur among resistance values of the respective resistors 944. In such a case, there arises a possibility that operation timings of respective transistors vary, a possibility that a resistance of the resistor is excessively high so that an abnormal operation of the transistor occurs, or a possibility that resistances of the resistors 944 are excessively high so that a capacitance of an electric current becomes small whereby seizure is liable to occur.

The present invention has been made to overcome the above-mentioned drawbacks, and it is an object of the present invention to provide a semiconductor device which can suppress a possibility that operation timings of respective transistors vary, a possibility that a resistance of the resistor is excessively high so that an abnormal operation of the transistor occurs, or a possibility that a resistance of the resistor is excessively high so that a capacitance of an electric current becomes small whereby seizure is liable to occur, and can decrease noises generated by high-speed switching in the same manner as conventional devices.

It is another object of the present invention to provide a method of manufacturing a semiconductor device which can manufacture such a semiconductor device.

[1] According to one aspect of the present invention, there is provided a semiconductor device which includes: a cell region which is defined on a semiconductor substrate on which a low resistance semiconductor layer of a first-conductive type or a second-conductive type and a drift layer of a first-conductive type are laminated; and a peripheral region which includes a gate finger forming region which surrounds the cell region, and a gate pad forming region which projects into the cell region, wherein the semiconductor device further includes in the cell region: the low resistance semiconductor layer; the drift layer of a first-conductive type which is formed over the low resistance semiconductor layer; a base region of a second-conductive type which is formed over a surface of the drift layer; a high-concentration semiconductor region of a first-conductive type which is formed over a surface of the base region; a gate electrode layer which is made of polysilicon, and is formed over the base region sandwiched between the drift layer and the high-concentration semiconductor region by way of a gate insulation layer, the semiconductor device further includes in the peripheral region: the low resistance semiconductor layer; the drift layer which is formed over the low resistance semiconductor layer; a gate lead line which is made of polysilicon, and is formed in the gate finger forming region and the gate pad forming region over the drift layer by way of a field oxide film; a gate finger which is made of metal, and is formed over the gate lead line in the gate finger forming region; and a gate pad which is made of metal, is formed over the gate lead line in the gate pad forming region, and is connected to the gate finger, the gate electrode layer and the gate lead line are electrically connected with each other by way of a resistor made of polysilicon containing an impurity, and an impurity concentration in polysilicon which forms the resistor is lower than an impurity concentration in polysilicon which forms the gate electrode layer.

[2] According to another aspect of the present invention, there is provided a semiconductor device which includes: a cell region which is defined on a semiconductor substrate on which a low resistance semiconductor layer of a first-conductive type or a second-conductive type and a drift layer of a first-conductive type are laminated; and a peripheral region which includes a gate finger forming region which surrounds the cell region, and a gate pad forming region which projects into the cell region, wherein the semiconductor device further includes, in the cell region: the low resistance semiconductor layer of a first-conductive type or a second-conductive type; the drift layer of a first-conductive type which is formed over the low resistance semiconductor layer; a base region of a second-conductive type which is formed over a surface of the drift layer; a plurality of trenches which are formed in the base region such that the trenches reach the drift layer; a high-concentration semiconductor region of a first-conductive type which is arranged within the base region and is formed such that at least a portion of the high-concentration semiconductor region is exposed on inner peripheral surfaces of the trenches; and a gate electrode layer which is made of polysilicon containing an impurity at a predetermined concentration, and is embedded in the inside of trenches by way of a gate insulation layer formed over the inner peripheral surfaces of the trenches, the semiconductor device further includes in the peripheral region: the low resistance semiconductor layer; the drift layer which is formed over the low resistance semiconductor layer; a gate lead line which is made of polysilicon, and is formed in the gate finger forming region and the gate pad forming region over the drift layer by way of a field oxide film; a gate finger which is made of metal, and is formed over the gate lead line in the gate finger forming region; and a gate pad which is made of metal, is formed over the gate lead line in the gate pad forming region, and is connected to the gate finger; the gate electrode layer and the gate lead line are electrically connected with each other by way of a resistor made of polysilicon containing an impurity, and an impurity concentration in polysilicon which forms the resistor is lower than an impurity concentration in polysilicon which forms the gate electrode layer.

[3] In the above-mentioned semiconductor device, it is preferable that the gate electrode layer is constituted of a plurality of gate electrode layers formed in a stripe shape.

[4] In the above-mentioned semiconductor device, it is preferable that the semiconductor device further includes a second gate lead line which is made of polysilicon containing an impurity at a predetermined concentration, extends from the gate pad forming region to the gate finger forming region on a side opposite to the gate pad forming region, and is formed over the drift layer by way of a field oxide film, and the gate electrode layer and the second gate lead line are electrically connected with each other by way of a second resistor which is made of polysilicon containing an impurity, and the impurity concentration in polysilicon which forms the second resistor is lower than the impurity concentration in polysilicon which forms the gate electrode layer.

[5] In the above-mentioned semiconductor device, it is preferable that the gate electrode layer is constituted of a plurality of gate electrode layers formed in a stripe shape, the second resistor is formed over one end of each gate electrode layer, and a resistance value of the second resistor closest to the gate finger or the gate pad out of the respective second resistors is higher than a resistance value of the second resistor remotest from the gate finger or the gate pad out of the respective second resistors.

[6] In the above-mentioned semiconductor device, it is preferable that a length of the second resistor closest to the gate finger or the gate pad out of the respective second resistors is larger than a length of the second resistor remotest from the gate finger or the gate pad out of the respective second resistors.

[7] In the above-mentioned semiconductor device, it is preferable that an impurity concentration in polysilicon which forms the second resistor closest to the gate finger or the gate pad out of the respective second resistors is lower than an impurity concentration in polysilicon which forms the second resistor remotest from the gate finger or the gate pad out of the respective second resistors.

[8] In the above-mentioned semiconductor device, it is preferable that the semiconductor device further includes a second gate finger which is made of metal, is formed over the second gate lead line, and is connected to the gate finger and the gate pad.

[9] In the above-mentioned semiconductor device, it is preferable that a width of the second resistor is equal to a width of the gate electrode layer.

[10] In the above-mentioned semiconductor device, it is preferable that a width of the resistor is equal to a width of the gate electrode layer.

[11] In the above-mentioned semiconductor device, it is preferable that the resistor is formed over the peripheral region.

[12] In the above-mentioned semiconductor device, it is preferable that the resistor is formed over the cell region.

[13] According to still another aspect of the present invention, there is provided a method of manufacturing a semiconductor device for manufacturing the semiconductor device according to any one of [1] to [12] which includes, in the following order, the steps of: forming a polysilicon layer having the same composition on forming regions where a gate electrode layer, a gate lead line and a resistor are respectively formed; and introducing an impurity into the polysilicon layers formed in the respective forming regions where the gate electrode layer and the gate lead line are formed out of the gate electrode layer, the gate lead line and the resistor.

[14] According to still another aspect of the present invention, there is provided a method of manufacturing a semiconductor device for manufacturing the semiconductor device according to any one of [4] to [9] which includes, in the following order, the steps of: forming a polysilicon layer having the same composition in forming regions where a gate electrode layer, a gate lead line, a second gate lead line, a resistor and a second resistor are respectively formed; and introducing an impurity into the polysilicon layers formed in the respective forming regions where the gate electrode layer, the gate lead line and the second gate lead line are formed out of respective forming regions where the gate electrode layer, the gate lead line, the second gate lead line, the resistor and the second resistor are formed.

[15] In the above-mentioned method of manufacturing a semiconductor device, it is preferable that the impurity is introduced by ion implantation in the step of introducing the impurity.

According to the semiconductor device of the present invention, the impurity concentration in polysilicon which forms the resistors is lower than the impurity concentration in polysilicon which forms the gate electrode layer and hence, in forming the resistors in steps of manufacturing the semiconductor device, it is possible to form the resistors having a higher resistance value than the gate electrode layers without forming the resistors having a narrower width than the gate electrode layers. Accordingly, it is unnecessary to manufacture the resistors having a narrower width than the gate electrode layers with high accuracy and hence, irregularities hardly occur in resistance values of the respective resistors. As a result, it is possible to suppress a possibility that operation timings of the respective transistors vary, a possibility that a resistance of the resistor is excessively high so that an abnormal operation of the transistor occurs, or a possibility that a resistance of the resistor is excessively high so that a capacitance of an electric current becomes small whereby seizure is liable to occur.

Further, according to the semiconductor device of the present invention, the gate electrode layers and the gate lead line are electrically connected with each other by way of the resistors and hence, in the same manner as a conventional semiconductor device, the falling of an electric current at the time of turning off the semiconductor device can be made gentle by increasing a charge/discharge time constant of the gate. As a result, dv/dt at an overshoot portion of a voltage at the time of turning off the semiconductor device can be decreased so that noises generated by high-speed switching can be decreased.

According to the semiconductor device of the present invention, the semiconductor device can acquire the above-mentioned advantageous effects even when the semiconductor device is a trench-type semiconductor device.

According to the method of manufacturing a semiconductor device of the present invention, an impurity is introduced into a polysilicon layer in the respective forming regions where the gate electrode layers and the gate lead line are formed out of the forming regions where the gate electrode layers, the gate lead line and the resistors are formed and hence, it is possible to manufacture a semiconductor device having the above-mentioned advantageous effects.

According to the method of manufacturing a semiconductor device of the present invention, a polysilicon layer having the same composition is formed in the respective forming regions where the gate electrode layers, the gate lead line and the resistors are respectively formed, and an impurity is introduced into the polysilicon layers formed in the respective forming regions where the gate electrode layers and the gate lead line are formed out of the forming regions where the gate electrode layers, the gate lead line and the resistors are formed and hence, the gate electrode layers, the gate lead line and the resistors can be formed in parallel or simultaneously. Accordingly, compared to the case where the gate electrode layers, the gate lead line and the resistors are formed respectively, the number of steps can be decreased and hence, the semiconductor device can be manufactured with high productivity.

According to the method of manufacturing a semiconductor device of the present invention, an impurity is introduced into a polysilicon layer in the respective forming regions where the gate electrode layers, the gate lead line and the second gate lead line are formed out of the forming regions where the gate electrode layers, the gate lead line, the second gate lead line, the resistors and the second resistors are formed and hence, it is possible to manufacture a semiconductor device having the above-mentioned advantageous effects.

According to the method of manufacturing a semiconductor device of the present invention, a polysilicon layer having the same composition is formed in forming regions where the gate electrode layers, the gate lead line, the second gate lead line, the resistors and the second resistors are respectively formed, and an impurity is introduced into the polysilicon layers formed in the respective forming regions where the gate electrode layers, the gate lead line and the second gate lead line are formed out of the forming regions where the gate electrode layers, the gate lead line, the second gate lead line, the resistors and the second resistors are formed and hence, the gate electrode layers, the gate lead line, the resistors and the second resistors can be formed in parallel or simultaneously. Accordingly, compared to the case where the gate electrode layers, the gate lead line, the resistors and the second resistors are formed respectively, the number of steps can be decreased and hence, the semiconductor device can be manufactured with high productivity.

BRIEF DESCRIPTION OF DRAWINGS

FIG. 3A-1 to 3C-2 are views for explaining a method of manufacturing a semiconductor device of the embodiment 1.

FIG. 4A-1 to 4C-2 are views for explaining the method of manufacturing a semiconductor device of the embodiment 1.

FIG. 5A-1 to 5C-2 are views for explaining the method of manufacturing a semiconductor device of the embodiment 1.

FIG. 6A-1 to 6C-2 are views for explaining the method of manufacturing a semiconductor device of the embodiment 1.

FIG. 7A-1 to 7C-2 are views for explaining the method of manufacturing a semiconductor device of the embodiment 1.

FIG. 18A to 18C are views for explaining a semiconductor device 200a according to an embodiment 12.

DESCRIPTION OF PREFERRED EMBODIMENTS

Figure 1A:
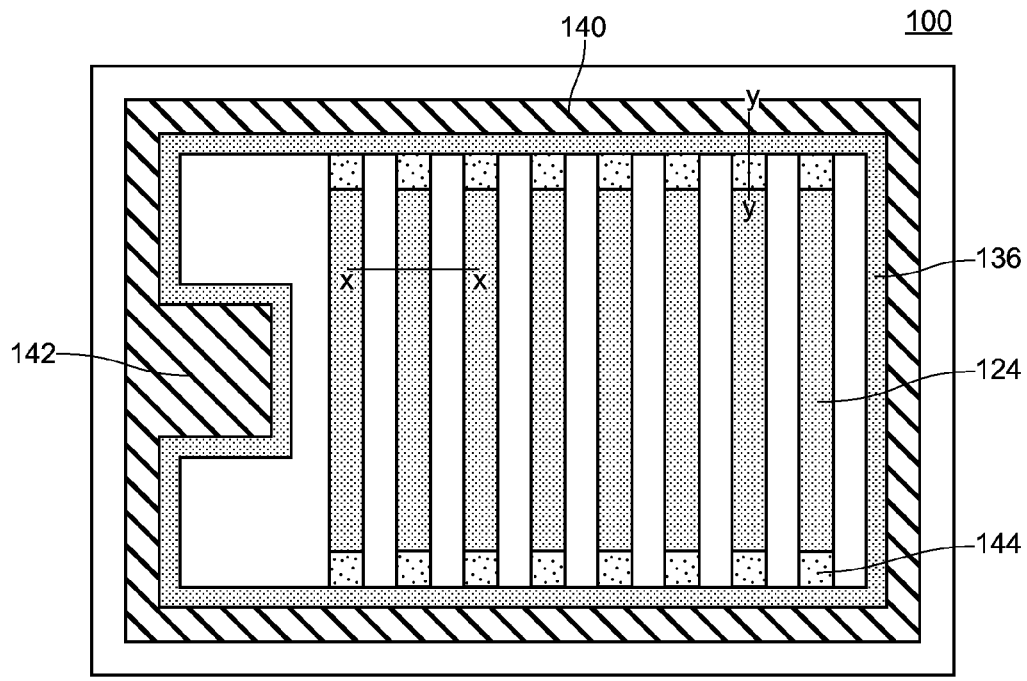
FIG. 1A to FIG. 1C are views for explaining a semiconductor device 100 according to an embodiment 1.

Hereinafter, a semiconductor device and a method of manufacturing a semiconductor device according to the present invention are explained in conjunction with embodiments shown in the drawings.

[Embodiment 1]

1. Constitution of Semiconductor Device 100 of the Embodiment 1

Firstly, the constitution of a semiconductor device 100 of an embodiment 1 is explained.

Figure 1B:
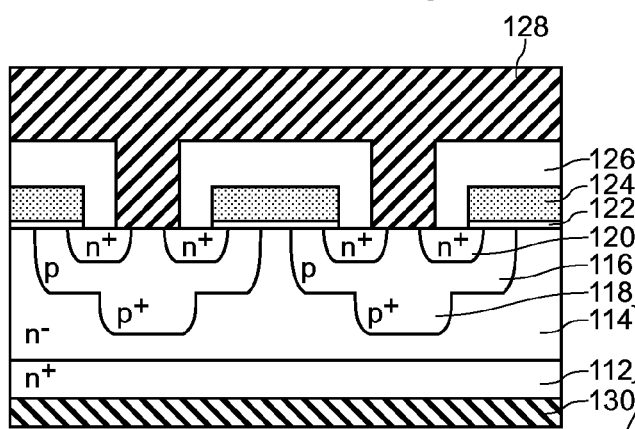
Figure 1C:
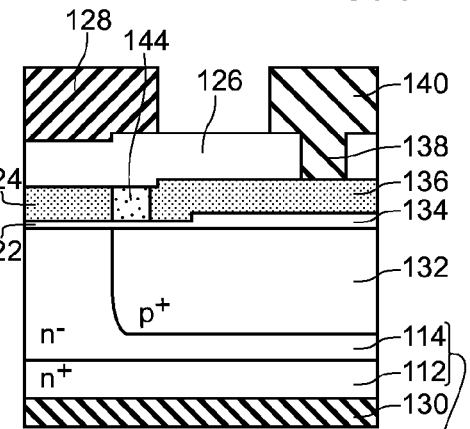

FIG. 1A to FIG. 1C are views for explaining the semiconductor device 100 of the embodiment 1. FIG. 1A is a plan view of the semiconductor device 100, FIG. 1B is a cross-sectional view taken along a line x-x in FIG. 1A, and FIG. 1C is a cross-sectional view taken along a line y-y in FIG. 1A. In FIG. 1A, an interlayer insulation layer 126 and a source electrode layer 128 are not shown in the drawing (hereinafter, the same goes for FIG. 8A, FIG. 9A and FIG. 10 to FIG. 16).

Figure 2:
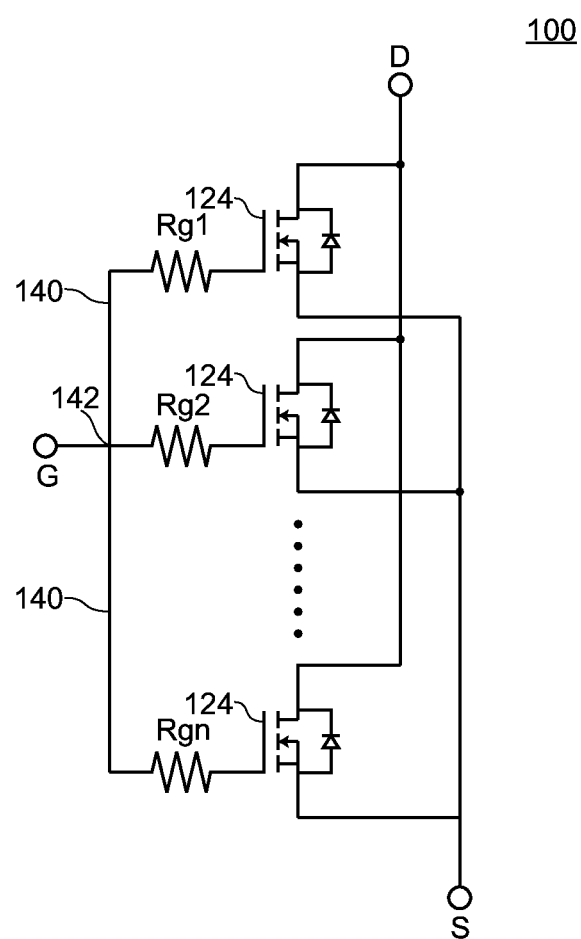
FIG. 2 is a view showing an equivalent circuit of the semiconductor device 100 of the embodiment 1.

FIG. 2 is a view showing an equivalent circuit of the semiconductor device 100 of the embodiment 1.

The semiconductor device 100 of the embodiment 1 is, as shown in FIG. 1A to FIG. 1C, a planar-type semiconductor device (MOSFET) which includes: a cell region defined on a semiconductor substrate 110 on which an $n^+$-type low resistance semiconductor layer 112 and an $n^-$-type drift layer 114 are laminated; and a peripheral region including a gate finger forming region which surrounds the cell region and a gate pad forming region which projects into the cell region.

As shown in FIG. 1A and FIG. 1B, the semiconductor device 100 of the embodiment 1 includes, in the cell region: the $n^+$-type low resistance semiconductor layer 112; the $n^-$-type drift layer 114 which is formed over the low resistance semiconductor layer 112; p-type base regions 116 which are formed over a surface of the drift layer 114; $n^+$-type high-concentration semiconductor regions (source regions) 120 which are formed over a surface of the base region 116; gate electrode layers 124 which are made of polysilicon and are formed over the base regions 116 sandwiched between the drift layer 114 and the source regions 120 by way of a gate insulation layer 122; and a drain electrode layer 130 which is formed by forming a metal film constituted of a multi-layered metal film such as a Ti—Ni—Au film on a second main surface side surface of the semiconductor substrate 110 (a surface of the low resistance semiconductor layer 112).

The semiconductor device 100 of the embodiment 1 further includes: a source electrode layer 128 which is formed in such a manner that the source electrode layer 128 is brought into contact with surfaces of the source regions 120 and surfaces of the base regions 116 in a state where the source electrode layer 128 is insulated from the gate electrode layers 124 by way of an interlayer insulation layer 126; and $p^+$-type projecting diffusion regions 118 which are formed in a downwardly projecting manner (in a deep direction) from the base regions 116.

As shown in FIG. 1A and FIG. 1C, the semiconductor device 100 of the embodiment 1 includes, in the peripheral region: the low resistance semiconductor layer 112; the drift layer 114 which is formed over the low resistance semiconductor layer 112; a gate lead line 136 which is made of polysilicon, is formed in the gate finger forming region and the gate pad forming region over the drift layer 114 by way of a field oxide film 134; a gate finger 140 which is made of metal and is formed over the gate lead line 136 in the gate finger forming region; and a gate pad 142 which is made of metal, is formed over the gate lead line 136 in the gate pad forming region, and is connected to the gate finger 140.

In the peripheral region, a $p^+$-type diffusion region 132 is formed over a surface of the drift layer 114, and a field oxide film 134 is formed over the $p^+$-type diffusion region 132.

The gate electrode layers 124 and the gate lead line 136 are electrically connected to each other by way of resistors 144 made of polysilicon containing an impurity.

The semiconductor device 100 of the embodiment 1 includes a plurality of base regions formed in a stripe shape as base regions 116, a plurality of $p^+$-type projecting diffusion regions formed in a stripe shape as the $p^+$-type projecting diffusion regions 118, and a plurality of gate electrode layers formed in a stripe shape as the gate electrode layers 124. Pitches at which the base regions 116, the $p^+$-type projecting diffusion regions 118 and the gate electrode layers 124 are formed are set to 15 μm, for example, respectively. A stripe width of the base region 116 is set to 9 μm, for example. A stripe width of the $p^+$-type projecting diffusion region 118 is set to 3.75 μm, for example. A stripe width of the gate electrode layer 124 (a width of the gate electrode layer 124) is set to 6 μm, for example.

Here, "a width of the gate electrode layer" is a length of the gate electrode layer in the direction (the lateral direction in FIG. 1A) which is perpendicular to the direction along which an electric current flows in the gate electrode layer and is horizontal (the longitudinal direction in FIG. 1A). "a length of the gate electrode layer" is a length of the gate electrode layer in the direction along which the electric current flows in the gate electrode layer (the longitudinal direction in FIG. 1A).

In the semiconductor device 100 of the embodiment 1, as shown in FIG. 1A to FIG. 1C, a MOSFET cell which is constituted of the low resistance semiconductor layer 112, the drift layer 114, the base region 116, the source regions 120, the gate electrode layer 124, the drain electrode layer 130 and the source electrode layer 128 is formed for each one of the plurality of gate electrode layers 124 formed in a stripe shape.

A thickness of the low resistance semiconductor layer 112 is set to 100 μm to 400 μm, and an impurity concentration in the low resistance semiconductor layer 112 is set to $1 \times 10^{19}$ $cm^{-3}$ to $1 \times 10^{20}$ $cm^{-3}$. A thickness of the drift layer 114 is set to 5 μm to 50 μm, and an impurity concentration in the drift layer 114 is set to $1 \times 10^{14}$ $cm^{-3}$ to $1 \times 10^{16}$ $cm^{-3}$. A depth of the base region 116 is set to 2 μm to 2.5 μm, and an impurity concentration in the base region 116 is set to $5 \times 10^{16}$ $cm^{-3}$ to $1 \times 10^{18}$ $cm^{-3}$. A depth of the source region 120 is set to 0.2 μm to 0.4 μm, and an impurity concentration in the source region 120 is set to $5 \times 10^{19}$ $cm^{-3}$ to $2 \times 10^{20}$ $cm^{-3}$. A depth of the $p^+$-type projecting diffusion region 118 and a depth of the $p^+$-type diffusion region 132 are set to 2.4 μm to 8.0 μm, and an impurity concentration in the $p^+$-type projecting diffusion region 118 and an impurity concentration in the $p^+$-type diffusion region 132 are set to $1 \times 10^{17}$ $cm^{-3}$ to $3 \times 10^{18}$ $cm^{-3}$.

The gate electrode layers 124 and the gate lead line 136 are made of polysilicon containing an impurity at a predetermined concentration. The gate electrode layers 124 and the gate lead line 136 are formed by the same step. To be more specific, the gate electrode layers 124 are formed such that a polysilicon film is formed by a CVD method and an impurity is introduced into the polysilicon film. As a method for introducing an impurity, an ion implantation method may be used. As an impurity, for example, phosphorus may be used. In this manner, by allowing polysilicon which forms the gate electrode layer 124 to contain an impurity, the number of electrons in polysilicon can be increased and hence, the resistance of the gate electrode layer 124 can be lowered.

A thickness of the gate electrode layer 124 is 500 nm, for example.

The gate insulation layer 122 is formed by a thermal oxidation method, and is formed of a silicon dioxide film having a thickness of 100 nm, for example. The field oxide film 134 is formed by a thermal oxidation method, and is formed of a silicon dioxide film having a thickness of 450 nm, for example. The interlayer insulation layer 126 is formed by a CVD method, and is formed of a PSG film having a thickness of 1000 nm.

The gate finger 140 is formed over the gate lead line 136 by way of the interlayer insulation layer 126, and is electrically connected to the gate lead line 136 by way of contact holes 138 formed in the interlayer insulation layer 126.

A gate pad 142 is formed over the gate lead line 136 by way of the interlayer insulation layer 126, and is electrically connected to the gate lead line 136 by way of the contact hole 138 formed in the interlayer insulation layer 126.

The resistors 144 are formed at both ends of each gate electrode layer 124 in the cell region. The resistor 144 made of polysilicon containing an impurity, and an impurity concentration in polysilicon which forms the resistor 144 is lower than an impurity concentration in polysilicon which forms the gate electrode layer 124 and an impurity concentration in polysilicon which forms the gate lead line 136. A width of the resistor 144 is equal to a width of the gate electrode layer 124.

"a width of the resistor" is a length of the resistor in the direction (the lateral direction in FIG. 1A) which is perpendicular to the direction along which an electric current flows in the resistor (longitudinal direction in FIG. 1A) and is horizontal, and "a length of the resistor" is a length of the resistor in the direction along which the electric current flows in the resistor (the longitudinal direction in FIG. 1A).

Next, an equivalent circuit of the semiconductor device 100 of the embodiment 1 is explained.

In the semiconductor device 100 of the embodiment 1, as shown in FIG. 1A, a plurality of MOSFET cells are connected to each other in parallel or simultaneously, the gate electrode layers 124 of each MOSFET cell are, as shown in FIG. 1A and FIG. 1C, electrically connected to the gate finger 140 via the resistors 144 and the gate lead line 136. Accordingly, it may be safe to consider that the gate electrode layers 124 of each MOSFET cell are, as shown in FIG. 2, electrically connected to the gate finger 140 byway of respective gate resistances Rg1, Rg2 . . . Rgn. Here, the gate resistance made of polysilicon resistances of the gate electrode layer 124, the resistor 144 and the gate lead line 136.

The gate finger 140 is, as shown in FIG. 2, connected to the gate pad 142, and the gate pad 142 is connected to a gate terminal G. The gate terminal G is connected to a control circuit (not shown in the drawing) via an external line (not shown in the drawing). Since the gate finger 140 and the gate pad 142 are made of metal, the resistance values of the gate finger 140 and the gate pad 142 are extremely low compared to the case where the gate finger 140 and the gate pad 142 are made of polysilicon.

Here, the respective resistors 144 are formed such that a width of each resistor 144 is equal to a width of the gate electrode layer 124 and impurity concentrations of polysilicons which forms respective resistors 144 are equal and hence, the respective gate resistances Rg1, Rg2 . . . Rgn become equal.

2. Method of Manufacturing a Semiconductor Device of the Embodiment 1.

Figures 1, 3A:
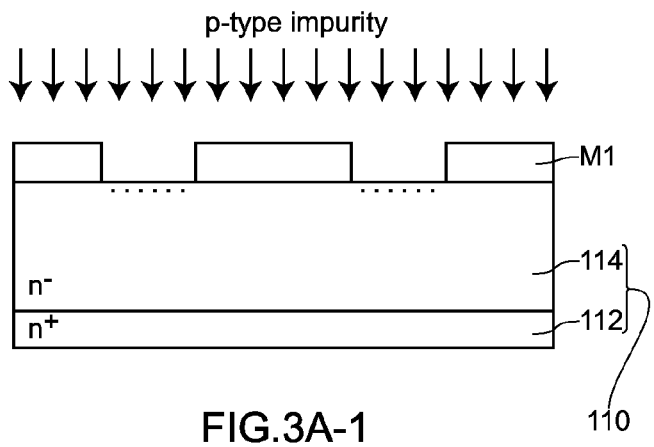
Figures 2, 3A:
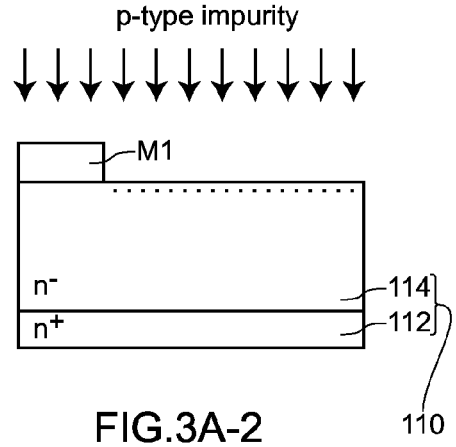
Figures 1, 7A:
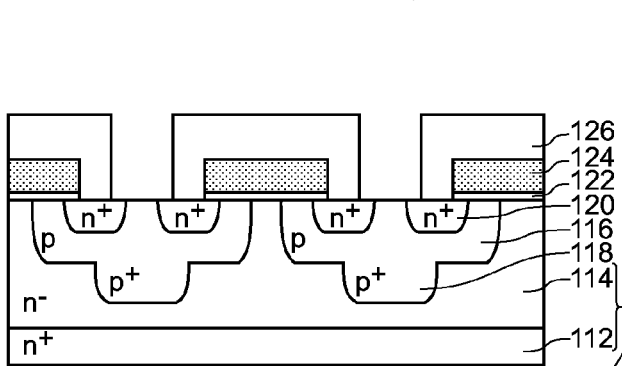
Figures 2, 7A:
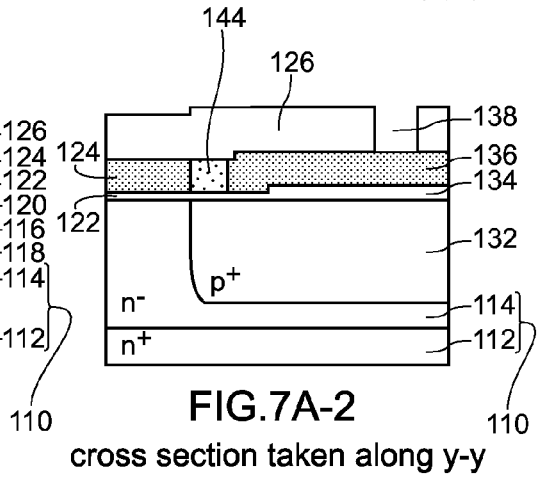

The semiconductor device 100 of the embodiment 1 can be manufactured by a manufacturing method having the following manufacturing steps (method of manufacturing a semiconductor device of the embodiment 1). FIG. 3A-1 to 7C-2 are views for explaining the method of manufacturing a semiconductor device of the embodiment 1. FIG. 3A-1 to FIG. 7C-1 are cross-sectional views taken along a line x-x in FIG. 1A for explaining the respective steps, and FIG. 3A-2 to FIG. 7C-2 are cross-sectional views taken along a line y-y in FIG. 1A for explaining the respective steps.

(1) Step of Preparing Semiconductor Substrate

The semiconductor substrate 110 is prepared by forming a silicon layer which forms the drift layer 114 on a silicon substrate which forms the low resistance semiconductor layer 112 by an epitaxial growth method. A thickness of the low resistance semiconductor layer 112 is set to 100 μm to 400 μm, for example, and an impurity concentration in the low resistance semiconductor layer 112 is set to $1 \times 10^{19}$ cm$^{-3}$ to $1 \times 10^{20}$ cm$^{-3}$. A thickness of the drift layer 114 is set to 5 μm to 50 μm, and an impurity concentration in the drift layer 114 is set to $1 \times 10^{14}$ cm$^{-3}$ to $1 \times 10^{16}$ cm$^{-3}$.

(2) Step of Forming p$^+$-Type Projecting Diffusion Region, p$^+$-Type Diffusion Region And Field Oxide Film Next, a p-type impurity is introduced into the regions on a surface of the drift layer 114 corresponding to the p$^+$-type projecting diffusion regions 118 and the p$^+$-type diffusion region 132 in such a manner that a mask M1 which has openings in regions corresponding to the p$^+$-type projecting diffusion region 118 and the p$^+$-type diffusion region 132 is formed, and a p-type impurity (boron ion, for example) is introduced into the surface of the drift layer 114 by way of the mask M1 by ion implantation (see FIG. 3A-1 and FIG. 3A-2).

Figures 1, 3B:
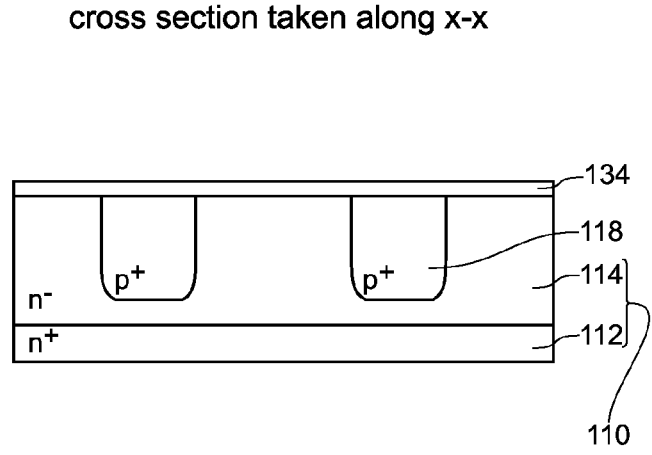
Figures 2, 3B:
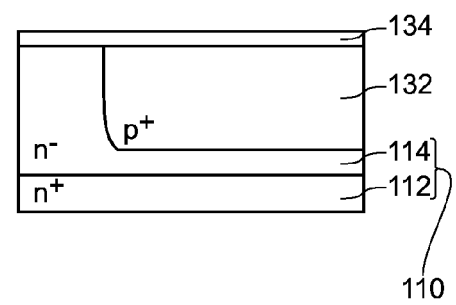

Next, the mask M1 is removed, and an annealing treatment for activating a p-type impurity is performed by applying a heat treatment to the semiconductor substrate 110 in an oxygen gas containing atmosphere thus forming the p$^+$-type projecting diffusion region 118 and the p$^+$-type diffusion region 132 (see FIG. 3B-1 and FIG. 3B-2). A forming depth of the p$^+$-type projecting diffusion region 118 and a forming depth of the p$^+$-type diffusion region 132 are set to 2.4 μm to 8.0 μm, and an impurity concentration in the p$^+$-type projecting diffusion region 118 and an impurity concentration in the p$^+$-type diffusion region 132 are set to $1 \times 10^{17}$ cm$^{-3}$ to $3 \times 10^{18}$ cm$^{-3}$ respectively. Here, a surface of the drift layer 114 is thermally oxidized so that the field oxide film 134 is formed. A thickness of the field oxide film 134 is set to 450 nm, for example.

(3) Step of Forming Gate Insulation Layer

Figures 1, 3C:
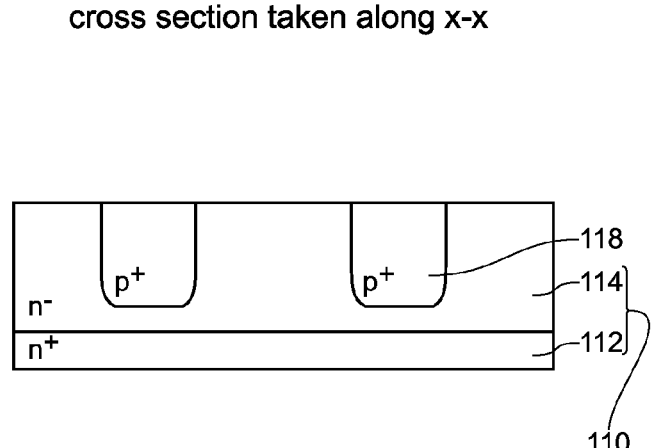
Figures 2, 3C:
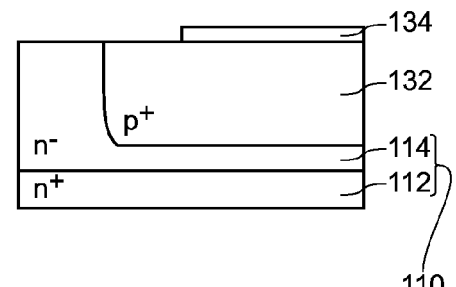

Next, after forming a mask (not shown in the drawing) which has an opening in the cell region, the field oxide film 134 is etched so that a surface of the whole cell region, a surface of the drift layer 114 and a portion of a surface of the p$^+$-type diffusion region 132 in the peripheral region are exposed respectively (see FIG. 3C-1 and FIG. 3C-2). Next, the gate insulation layer 122 is formed in the cell region by thermally oxidizing a surface of the drift layer 114 by applying a heat treatment to the semiconductor substrate 110 in an oxygen-gas-containing atmosphere (see FIG. 4A-1 and FIG. 4A-2). A thickness of the gate insulation layer 122 is set to 100 nm, for example.

(4) Step of Forming Polysilicon Layer

Next, polysilicon layers 124' having the same composition are formed by a CVD method on respective forming regions where the gate electrode layer 124, the gate lead line 136 and the resistor 144 are formed (see FIG. 4B-1 and FIG. 4B-2). To be more specific, the polysilicon layer 124' having low resistance is formed over a surface of the field oxide film 134 and a surface of the gate insulation layer 122. A thickness of the polysilicon layer 124' is set to 500 nm, for example.

(5) First Step of Introducing Impurity

Then, an n-type impurity (phosphorus ion, for example) is injected into the polysilicon layer 124' by ion implantation (see FIG. 4C-1 and FIG. 4C-2). An impurity concentration of the n-type impurity to be injected by ion implantation is set to $4 \times 10^{15}$ cm$^{-3}$ to $8 \times 10^{15}$ cm$^{-3}$.

Next, masks (not shown in the drawing) are formed in the respective forming regions where the gate electrode layers 124, the gate lead line 136 and the resistors 144 are formed and, thereafter, the polysilicon layer 124' is etched (see FIG. 5A-1 and FIG. 5A-2).

(6) Step of Forming Base Regions

Next, using the polysilicon layer 124' and the field oxide film 134 as masks, a p-type impurity (boron ion, for example) is injected into a surface of the drift layer 114 through the gate insulation layer 122 by ion implantation thus introducing the p-type impurity to regions on the surface of the drift layer 114 corresponding to the base regions 116 (see FIG. 5B-1 and FIG. 5B-2).

Next, an annealing treatment for activating a p-type impurity is performed by applying a heat treatment to the semiconductor substrate 110 thus forming the base regions 116 (see FIG. 5C-1 and FIG. 5C-2). A depth of the base region 116 is set to 2 µm to 2.5 µm, and an impurity concentration in the base region 116 is set to $5 \times 10^{16}$ cm$^{-3}$ to $1 \times 10^{18}$ cm$^{-3}$.

(7) Second Step of Introducing Impurity

Figures 1, 6A:
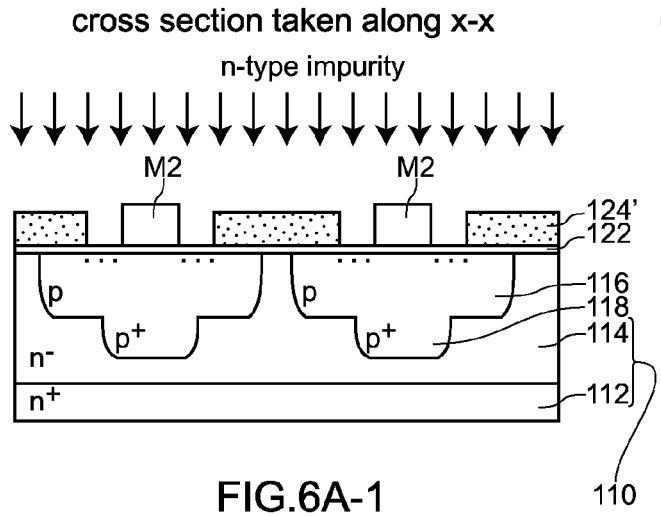
Figures 2, 6A:
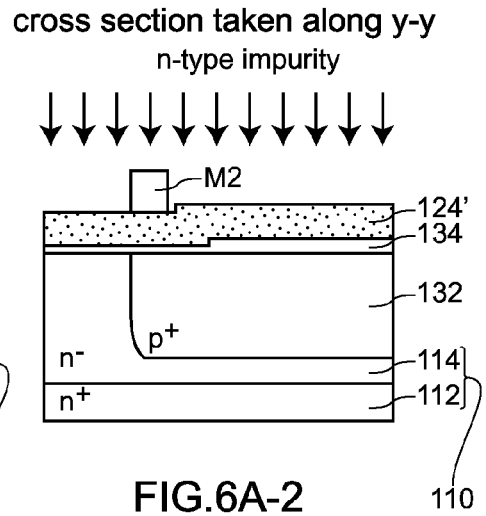

Next, an impurity is introduced into the polysilicon layers 124' in the respective forming regions where the gate electrode layers 124 and the gate lead line 136 are formed out of the respective forming regions where the gate electrode layers 124, the gate lead line 136 and the resistors 144 are formed. To be more specific, a mask M2 is formed to cover the regions other than the regions where the gate electrode layers 124 are formed, the region where the gate lead line 136 is formed and the regions where the source regions 120 are formed. By injecting an n-type impurity (phosphorus ion, for example) into surfaces of the polysilicon layers 124' and the regions where the source regions 120 are formed by ion implantation using the mask M2, the n-type impurity is introduced into the regions where the polysilicon layers 124' and the source regions 120 are formed (see FIG. 6A-1 and FIG. 6A-2). An impurity concentration of n-type impurity to be injected by ion implantation is set to $3 \times 10^{15}$ cm$^{-3}$ to $8 \times 10^{15}$ cm$^{-3}$.

(8) Heat Treatment Step

Figures 1, 6B:
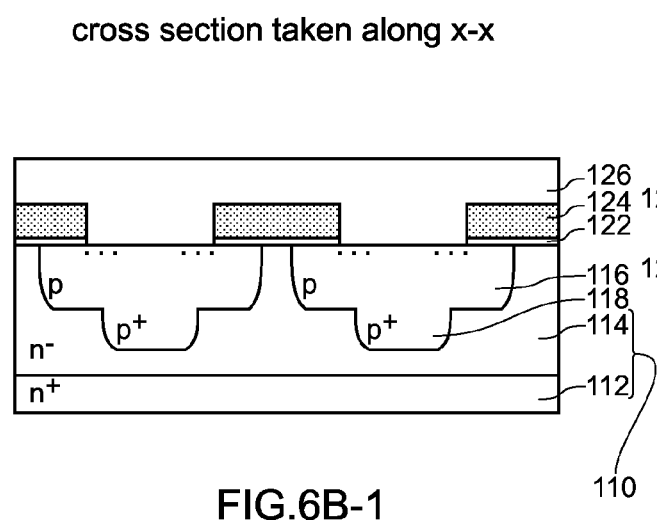
Figures 2, 6B:
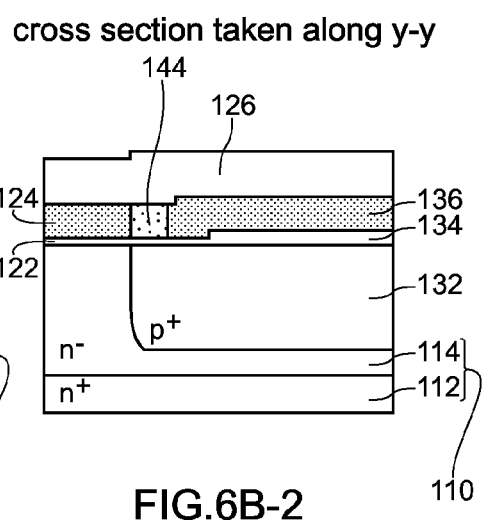
Figures 1, 6C:
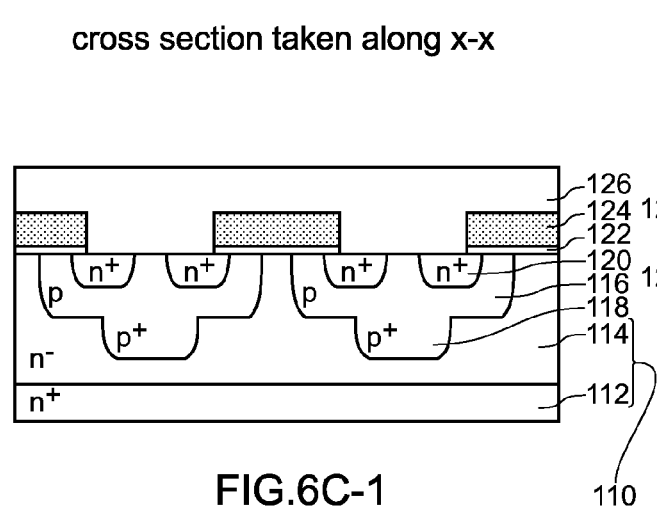
Figures 2, 6C:
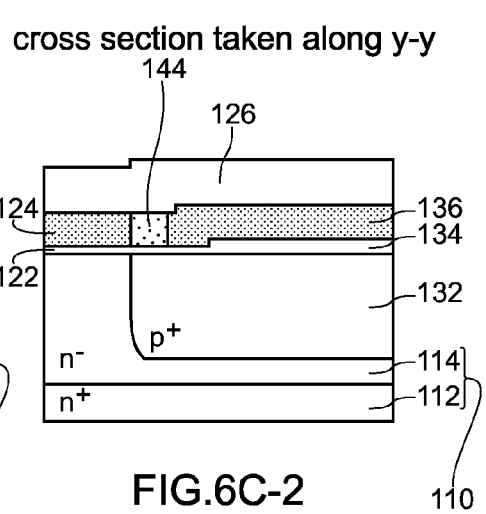

Next, the mask M2 is removed, and the interlayer insulation layer 126 made of PSG and having a thickness of 1000 nm, for example, is formed over the whole surface of the semiconductor substrate 110 on a first main surface side by a CVD method (see FIG. 6B-1 and FIG. 6B-2). Next, an annealing treatment for activating the n-type impurity is performed by applying a heat treatment to the semiconductor substrate 110 thus annealing the interlayer insulation layer 126 and forming the source regions 120, the gate electrode layers 124, the gate lead line 136 and the resistors 144 (see FIG. 6C-1 and FIG. 6C-2). A depth of the source region 120 is set to 0.2 µm to 0.4 µm. An impurity concentration in the source regions 120 and an impurity concentration in polysilicon which forms the resistors 144 are respectively set to $5 \times 10^{19}$ cm$^{-3}$ to $2 \times 10^{20}$ cm$^{-3}$, and an impurity concentration in polysilicon which forms the gate electrode layers 124 and an impurity concentration in polysilicon which forms the gate lead line 136 are respectively set to $5 \times 10^{19}$ cm$^{-3}$ to $2 \times 10^{20}$ cm$^{-3}$.

(9) Step of Forming Source Electrode Layers, Gate Pad and Gate Finger

Figures 1, 7B:
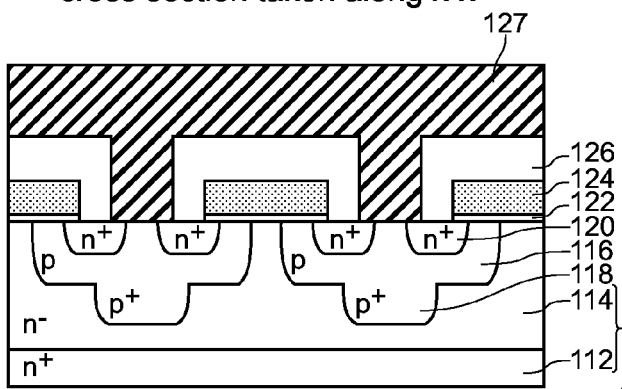
Figures 2, 7B:
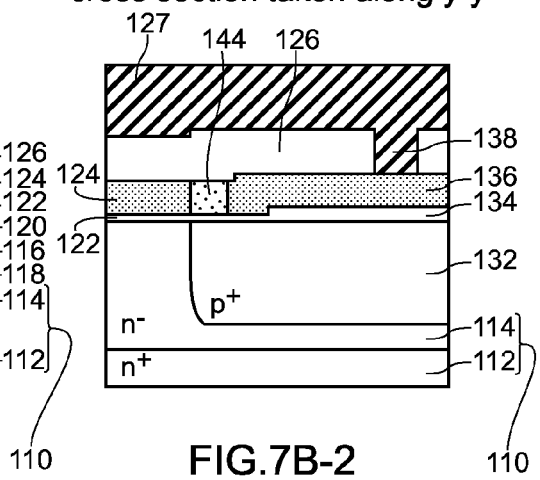
Figures 1, 7C:
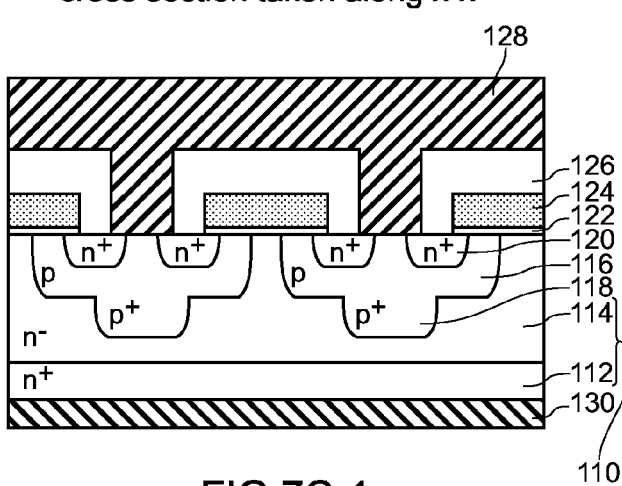
Figures 2, 7C:
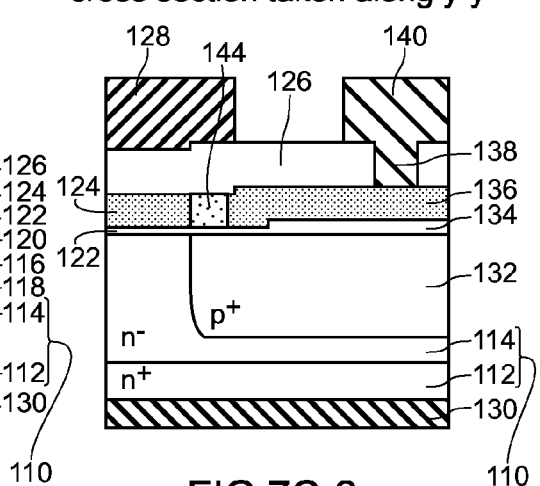

Next, the interlayer insulation layers 126 formed over portions where the gate finger 140 and the gate pad 142 are brought into contact with the gate lead line 136 (contact holes 138) and portions where the source electrode layer 128 is brought into contact with the source regions 120 and the base regions 116 are selectively removed respectively (see FIG. 7A-1 and FIG. 7A-2) and, thereafter, a metal layer 127 made of aluminum is formed by a sputtering method from above the interlayer insulation layer 126 (see FIG. 7B-1 and FIG. 7B-2).

Next, the metal layer 127 is divided into the source electrode 128, the gate finger 140 and the gate pad 142 by removing predetermined regions of the metal layer 127 by etching thus forming the source electrode layer 128, the gate finger 140 and the gate pad 142. A thickness of the source electrode layer 128, a thickness of the gate finger 140 and a thickness of the gate pad 142 are set to 4 µm, for example (see FIG. 7C-1 and FIG. 7C-2).

(10) Step of Forming Drain Electrode Layer

Next, a metal film formed of a multi-layered metal film such as a Ti—Ni—Au film is formed over a surface of the semiconductor substrate 110 on the second main surface side (surface of the low resistance semiconductor layer 112) thus forming the drain electrode layer 130 (see FIG. 7C-1 and FIG. 7C-2). A thickness of the drain electrode layer 130 is set to 0.5 µm, for example, over the whole multi-layered metal film.

Through the above-mentioned steps, the semiconductor device 100 of the embodiment 1 can be manufactured.

3. Advantageous Effects Acquired by the Semiconductor Device 100 and Method of Manufacturing a Semiconductor Device of the Embodiment 1

According to the semiconductor device 100 of the embodiment 1, the impurity concentration in polysilicon which forms the resistors 144 is lower than the impurity concentration in polysilicon which forms the gate electrode layer 124 and hence, in forming the resistors 144 in steps of manufacturing the semiconductor device, it is possible to form the resistors 144 having a higher resistance value than the gate electrode layers 124 without forming the resistors 144 having a narrower width than the gate electrode layers 124. Accordingly, it is unnecessary to manufacture the resistors 144 having a narrower width than the gate electrode layers 124 with high accuracy and hence, irregularities hardly occur in resistance values of the respective resistors 144. As a result, it is possible to suppress a possibility that operation timings of the respective transistors vary, a possibility that a resistance of the resistor is excessively high so that an abnormal operation of the transistor occurs, or a possibility that a resistance of the resistor is excessively high so that a capacitance of an electric current becomes small whereby seizure is liable to occur.

Further, according to the semiconductor device 100 of the embodiment 1, the gate electrode layers 124 and the gate lead line 136 are electrically connected with each other by way of the resistors 144 and hence, in the same manner as a conventional semiconductor device, it is possible to make the falling of an electric current at the time of turning off the semiconductor device 100 gentle by increasing a charge/discharge time constant of the gate. As a result, it is possible to provide a semiconductor device where dv/dt at an overshoot portion of a voltage at the time of turning off the semiconductor device 100 can be decreased so that noises generated by high-speed switching can be decreased.

According to the semiconductor device 100 of the embodiment 1, the gate electrode layers 124 are constituted of a plurality of gate electrode layers formed in a stripe shape and hence, an electric field in the cell region can be effectively alleviated.

According to the semiconductor device 100 of the embodiment 1, a width of the resistor 144 is set equal to a width of the gate electrode layer 124 and hence, in the steps of manufacturing the semiconductor device, the resistance values of the resistors 144 can be easily adjusted. As a result, irregularities in resistance values of the respective resistors 144 hardly occur.

According to the semiconductor device 100 of the embodiment 1, the resistors 144 are formed in the cell region and hence, it is sufficient to form the resistor 144 on portions of the gate electrode layer 124. Accordingly, compared to the case where resistors are formed over the gate lead line 136 having a complicated current path, it is possible to easily adjust resistance values of the resistors 144 such that the respective gate resistances become equal.

According to the semiconductor device 100 of the embodiment 1, an impurity is introduced into the polysilicon layers 124' in the respective forming regions where the gate electrode layers 124 and the gate lead line 136 are formed out of the forming regions where the gate electrode layers 124, the gate lead line 136 and the resistors 144 are formed and hence, it is possible to manufacture a semiconductor device having the above-mentioned advantageous effects.

According to the method of manufacturing a semiconductor device of the embodiment 1, the polysilicon layers 124' having the same composition are formed over the forming regions where the gate electrode layers 124, the gate lead line 136 and the resistors 144 are formed, and an impurity is introduced into the polysilicon layers 124' formed in the respective forming regions where the gate electrode layers 124 and the gate lead line 136 are formed out of the forming regions where the gate electrode layers 124, the gate lead line 136 and the resistors 144 are formed and hence, the gate electrode layers 124, the gate lead line 136 and the resistors 144 can be formed in parallel or simultaneously. Accordingly, compared to the case where the gate electrode layers 124, the gate lead line 136 and the resistors 144 are formed respectively, the number of steps can be decreased and hence, the semiconductor device can be manufactured with high productivity.

According to the method of manufacturing a semiconductor device of the embodiment 1, an impurity is introduced by ion implantation in the impurity introducing step (second step of introducing impurity) and hence, an impurity can be accurately introduced into the respective forming regions where the gate electrode layers 124 and the gate lead line 136 are formed.

[Embodiment 2]

Figure 8A:
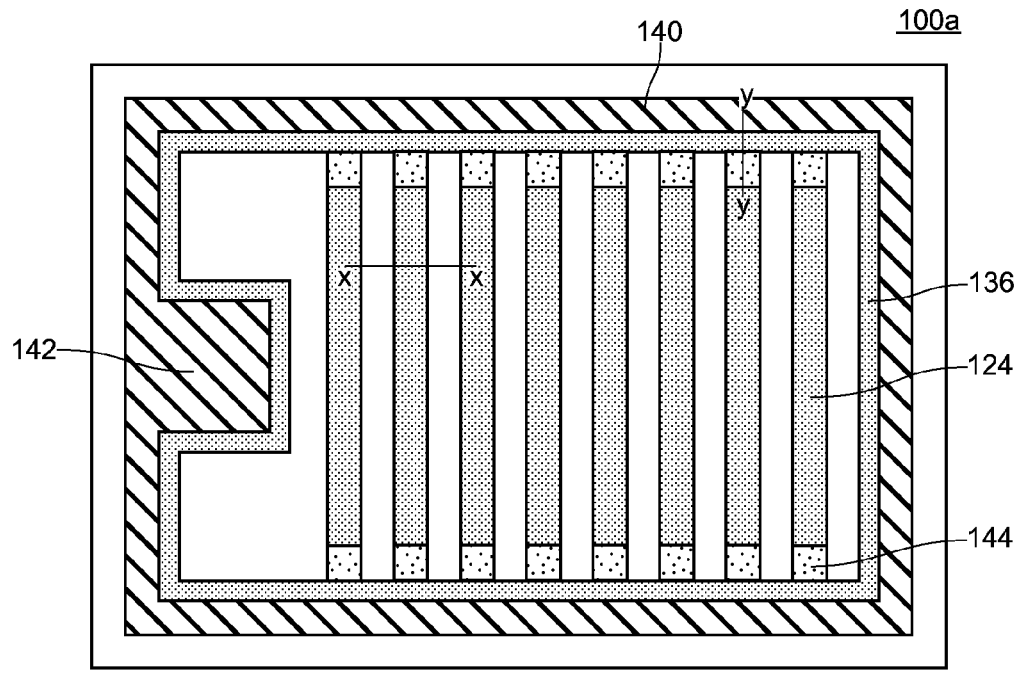
FIG. 8A to 8C are views for explaining a semiconductor device 100a according to an embodiment 2.
Figure 8B:
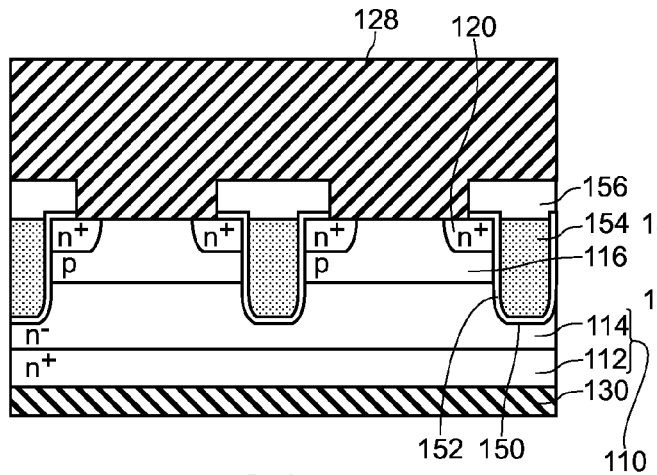
Figure 8C:
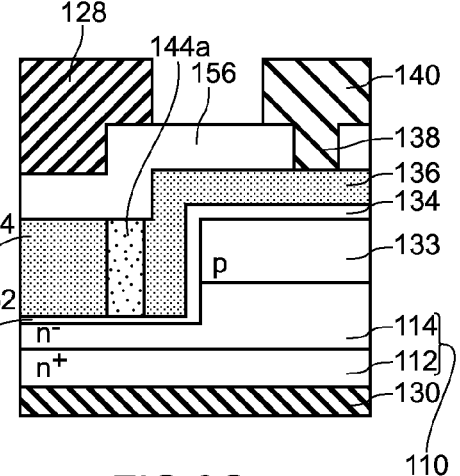

FIG. 8A to FIG. 8C are views for explaining a semiconductor device 100*a* according to an embodiment 2. FIG. 8A is a plan view of the semiconductor device 100*a*, FIG. 8B is a cross-sectional view taken along a line x-x in FIG. 8A, and FIG. 8C is a cross-sectional view taken along a line y-y in FIG. 8A. In FIG. 8A to FIG. 8C, symbol 133 indicates a p-type diffusion region.

Although the semiconductor device 100*a* of the embodiment 2 basically has substantially the same constitution as the semiconductor device 100 of the embodiment 1, the semiconductor device 100*a* of the embodiment 2 differs from the semiconductor device 100 of the embodiment 1 with respect to a point that the semiconductor device 100*a* is not a planar-type semiconductor device but a trench-type semiconductor device. That is, the semiconductor device 100*a* of the embodiment 2, as shown in FIG. 8A to FIG. 8C, in a cell region, includes: an n$^+$-type low resistance semiconductor layer 112; an n$^-$-type drift layer 114 formed over the low resistance semiconductor layer 112; a p-type base region 116 formed over a surface of the drift layer 114; a plurality of trenches 150 formed in the base region 116 such that the trenches 150 reach the drift layer 114; n$^+$-type high-concentration semiconductor regions (source regions) 120 which are arranged in the inside of the base region 116 and each of which has at least a portion thereof exposed to an inner peripheral surface of the trench 150; and gate electrode layers 154 each of which is made of polysilicon containing an impurity at a predetermined concentration and is embedded in the inside of the trench 150 by way of a gate insulation layer 152 formed over an inner peripheral surface of the trench 150.

The semiconductor device 100*a* of the embodiment 2 further includes, in the cell region, a source electrode layer 128 formed in contact with surfaces of the source regions 120 and a surface of the base region 116 in a state where the source electrode layer 128 is insulated from the gate electrode layers 154 by way of interlayer insulation layer 156.

In the semiconductor device 100*a* of the embodiment 2, the gate electrode layers 154 and a gate lead line 136 are electrically connected with each other by way of resistors 144*a* made of polysilicon containing an impurity.

In this manner, although the semiconductor device 100*a* of the embodiment 2 differs from the semiconductor device 100 of the embodiment 1 with respect to a point that the semiconductor device 100*a* is not a planar-type semiconductor device but a trench-type semiconductor device, in the same manner as the semiconductor device 100 of the embodiment 1, an impurity concentration in polysilicon which forms the resistor 144*a* is lower than an impurity concentration in polysilicon which forms the gate electrode layer 124. Accordingly, in forming the resistor 144*a* in steps of manufacturing the semiconductor device, it is possible to form the resistor 144*a* having a higher resistance value than the gate electrode layer 124 without forming the resistor 144*a* having a narrower width than the gate electrode layer 124. Accordingly, it is unnecessary to manufacture the resistor having a narrower width than the gate electrode layer 124 with high accuracy and hence, irregularities hardly occur in resistance values of the respective resistors 144*a*. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

The semiconductor device 100*a* of the embodiment 2 has substantially the same constitution as the semiconductor device 100 of the embodiment 1 except for the point that the semiconductor device 100*a* of the embodiment 2 is not a planar-type semiconductor device but a trench-type semiconductor device. Accordingly, out of the advantageous effects which the semiconductor device 100 of the embodiment 1 acquires, the semiconductor device 100*a* of the embodiment 2 acquires the same advantageous effects as the semiconductor device 100 of the embodiment 1 with respect to the constitutions of the semiconductor device 100*a* of the embodiment 2 substantially equal to the constitutions of the semiconductor device 100 of the embodiment 1.

[Embodiment 3]

Figure 9A:
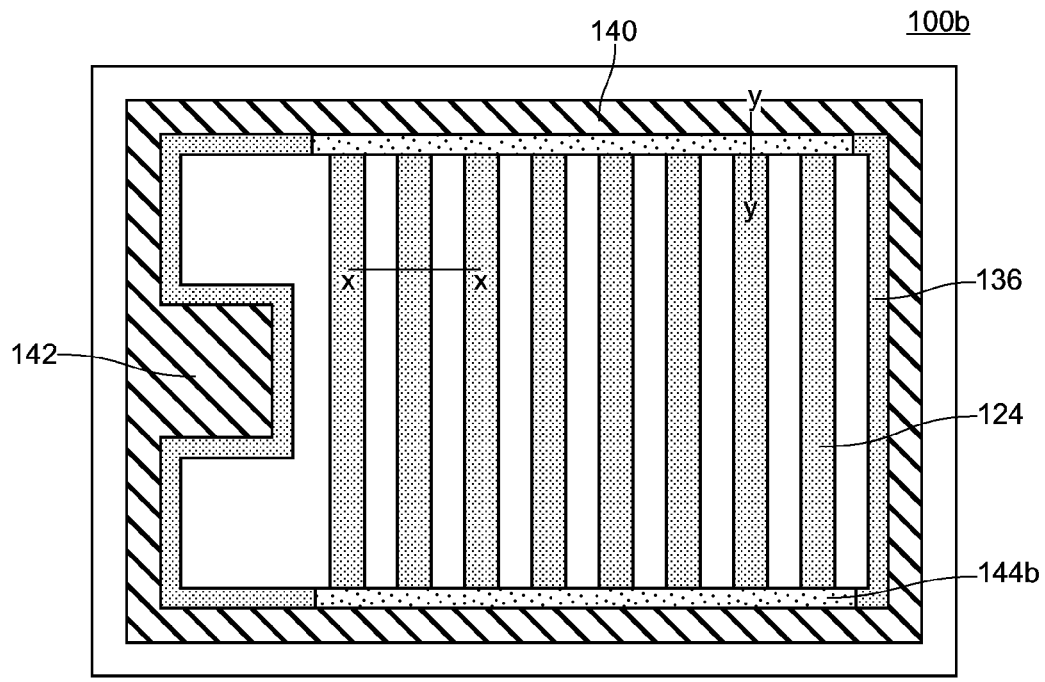
FIG. 9A to 9C are plan views for explaining a semiconductor device 100b according to an embodiment 3.
Figure 9B:
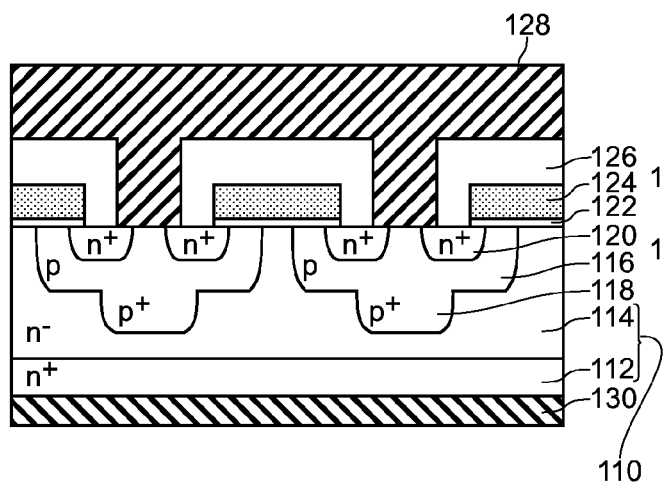
Figure 9C:
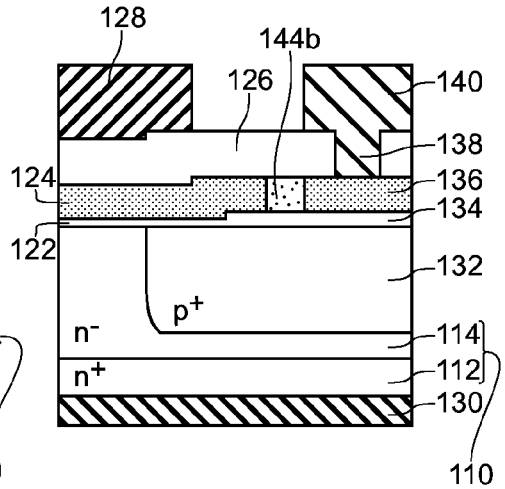

FIG. 9A to FIG. 9C are plan views for explaining a semiconductor device 100*b* according to an embodiment 3. FIG. 9A is a plan view of the semiconductor device 100*b*, FIG. 9B is a cross-sectional view taken along a line x-x in FIG. 9A, and FIG. 9C is a cross-sectional view taken along a line y-y in FIG. 9A.

Although the semiconductor device 100*b* of the embodiment 3 basically has substantially the same constitution as the semiconductor device 100 of the embodiment 1, the semiconductor device 100*b* of the embodiment 3 differs from the semiconductor device 100 of the embodiment 1 with respect to a point that resistors are formed in a peripheral region. That is, in the semiconductor device 100b of the embodiment 3, as shown in FIG. 9A to FIG. 9C, the resistors 144b are formed such that the resistors 144b are formed over portions of regions where a gate lead line 136 is formed.

The gate electrode layers 124 are formed such that the gate electrode layers 124 extend to positions where the gate electrode layers 124 are brought into contact with peripheral regions and hence, a length of the gate electrode layer 124 of the embodiment 3 is set longer than a length of the gate electrode layer 124 of the embodiment 1.

In this manner, although the semiconductor device 100b of the embodiment 3 differs from the semiconductor device 100 of the embodiment 1 with respect to a point that the resistors are formed in the peripheral region, in the same manner as the semiconductor device 100 of the embodiment 1, an impurity concentration in polysilicon which forms the resistor 144b is lower than an impurity concentration in polysilicon which forms the gate electrode layer 124. Accordingly, in forming the resistor 144b in steps of manufacturing the semiconductor device, it is possible to form the resistor 144b having a higher resistance value than the gate electrode layer 124 without forming the resistor 144b having a narrower width than the gate electrode layer 124. Accordingly, it is unnecessary to form the resistor 144b having a narrower width than the gate electrode layer 124 with high accuracy and hence, irregularities hardly occur in resistance values of the respective resistors 144b. As a result, it is possible to suppress a possibility that operation timings of respective transistors vary, a possibility that a transistor having a resistor with excessively high resistance causes an abnormal operation, or a possibility that a capacitance of an electric current becomes small due to an excessively high resistance of a resistor so that seizure is liable to occur.

Further, according to the semiconductor device 100b of the embodiment 3, the resistors 144b are formed in the peripheral region and hence, it is possible to form a wide cell region. As a result, a semiconductor device having a low ON resistance can be realized.

The semiconductor device 100b of the embodiment 3 has substantially the same constitution as the semiconductor device 100 of the embodiment 1 except for the point that the resistors are formed in the peripheral regions. Accordingly, out of the advantageous effects which the semiconductor device 100 of the embodiment 1 acquires, the semiconductor device 100b of the embodiment 3 acquires the same advantageous effects as the semiconductor device 100 of the embodiment 1 with respect to the constitutions of the semiconductor device 100b of the embodiment 3 substantially equal to the constitutions of the semiconductor device 100 of the embodiment 1.

[Embodiment 4]

Figure 10:
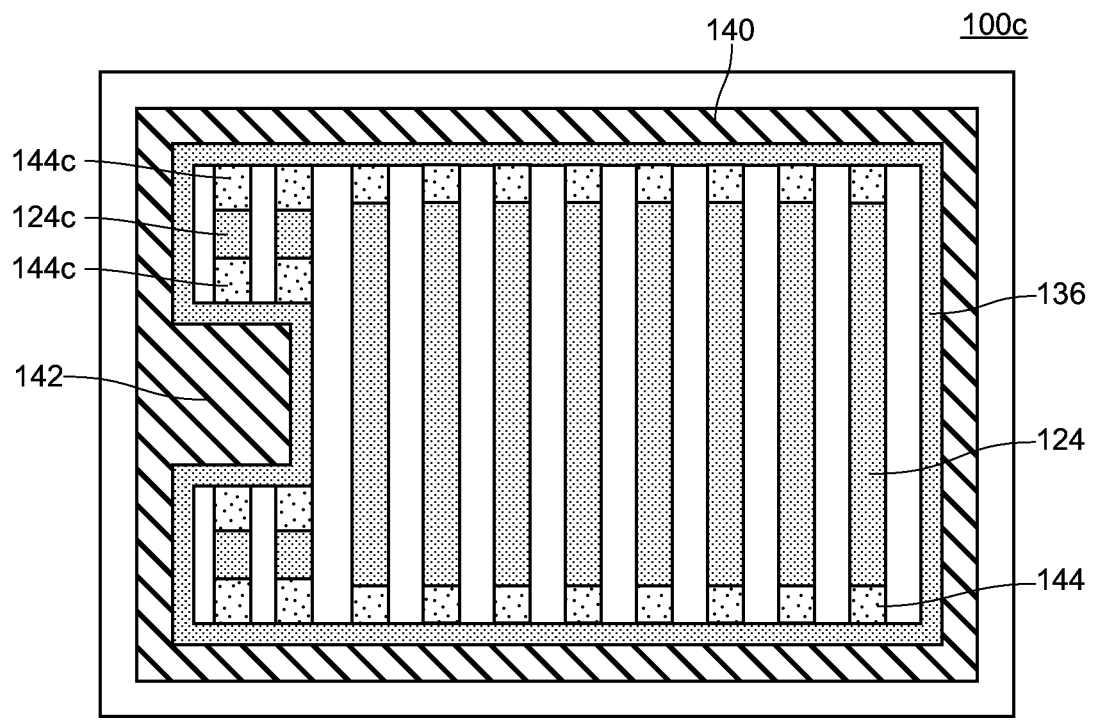
FIG. 10 is a plan view for explaining a semiconductor device 100c according to an embodiment 4.

FIG. 10 is a plan view for explaining a semiconductor device 100c according to an embodiment 4.

Although the semiconductor device 100c of the embodiment 4 basically has substantially the same constitution as the semiconductor device 100 of the embodiment 1, the semiconductor device 100c of the embodiment 4 differs from the semiconductor device 100 of the embodiment 1 with respect to a point that gate electrode layers are formed also between a gate pad forming region and a gate finger forming region. That is, in the semiconductor device 100c of the embodiment 4, as shown in FIG. 10, gate electrode layers 124c are also formed between gate lead lines in the gate pad forming region and gate lead lines in the gate finger forming region.

A resistor 144c is formed over both ends of the gate electrode layer 124c respectively, and the gate electrode layer 124c is electrically connected with the gate lead line in the gate pad forming region and the gate lead line in the gate finger forming region by way of the resistors 144c. The gate electrode layers 124c have the same composition as the gate electrode layers 124 and are formed in the same step as the gate electrode layers 124.

Two pairs of gate electrode layers 124c each of which is constituted of two gate electrode layers 124c are formed in symmetry in the direction (vertical direction in FIG. 10) perpendicular to the direction that gate pad forming region projects into a cell region (right direction in FIG. 10). The gate electrode layers 124c are arranged parallel to a plurality of gate electrode layers which are formed in a stripe shape as gate electrode layers 124. The respective gate resistances of the gate electrode layers 124c are adjusted to be equal to the respective gate resistances of the gate electrode layers 124.

To be more specific, a length of the gate electrode layer 124c is shorter than a length of the respective gate electrode layers 124. Accordingly, a polysilicon resistance of the gate electrode layer 124c is lower than a polysilicon resistance of the gate electrode layer 124. Accordingly, a resistance value of the resistor 144c is adjusted such that the respective gate resistances of the gate electrode layers 124 become equal by setting a length of the resistor 144c larger than a length of the resistor 144.

In this manner, although the semiconductor device 100c of the embodiment 4 differs from the semiconductor device 100 of the embodiment 1 with respect to a point that the gate electrode layers are formed also between the gate pad forming region and the gate finger forming region, in the same manner as the semiconductor device 100 of the embodiment 1, an impurity concentration in polysilicon which forms the resistors 144, 144c is lower than an impurity concentration in polysilicon which forms the gate electrode layers 124, 124c. Accordingly, in forming the resistors 144, 144c in steps of manufacturing the semiconductor device, it is possible to form the resistors 144, 144c having a higher resistance value than the gate electrode layers 124, 124c without forming the resistors 144, 144c having a narrower width than the gate electrode layers 124, 124c. Accordingly, it is unnecessary to manufacture the resistors 144, 144c having a narrower width than the gate electrode layers 124, 124c with high accuracy and hence, the variation in resistance values of the respective resistors 144, 144c hardly occur. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

The semiconductor device 100c of the embodiment 4 has substantially the same constitution as the semiconductor device 100 of the embodiment 1 except for the point that the gate electrode layers are formed also between the gate pad forming region and the gate finger forming region. Accordingly, out of the advantageous effects which the semiconductor device 100 of the embodiment 1 acquires, the semiconductor device 100c of the embodiment 4 acquires the same advantageous effects as the semiconductor device 100 of the embodiment 1 with respect to the constitutions of the semiconductor device 100c of the embodiment 4 substantially equal to the constitutions of the semiconductor device 100 of the embodiment 1.

[Embodiment 5]

Figure 11:
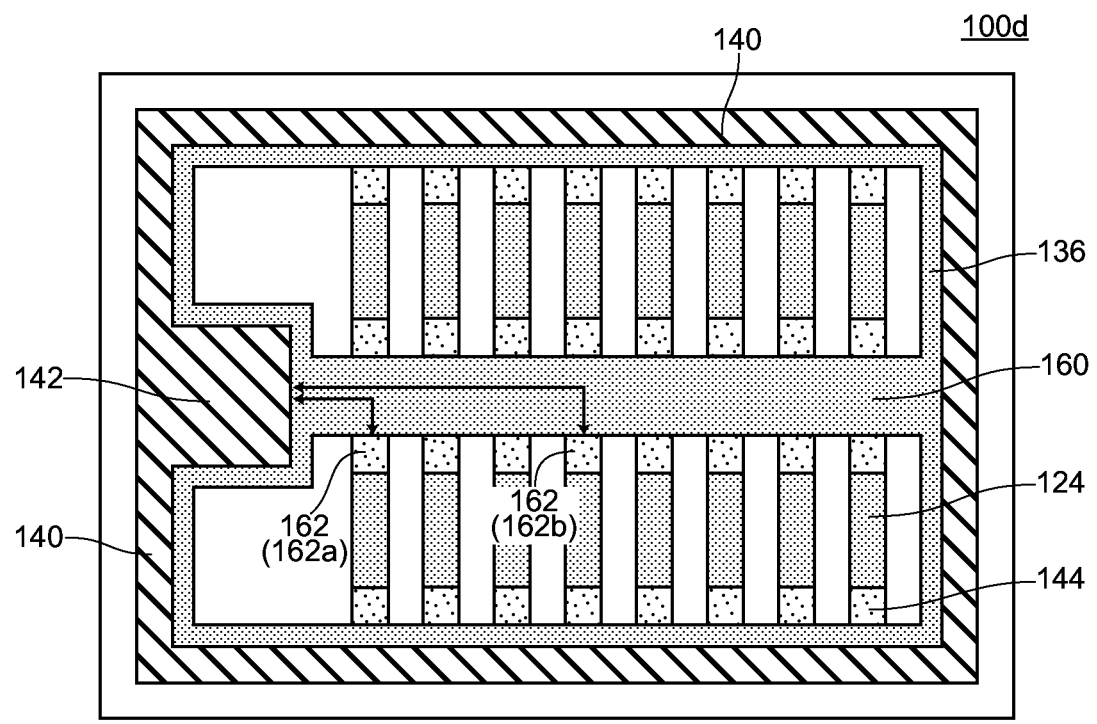
FIG. 11 is a plan view for explaining a semiconductor device 100d according to an embodiment 5.

FIG. 11 is a plan view for explaining a semiconductor device 100d according to an embodiment 5.

Although the semiconductor device 100*d* of the embodiment 5 basically has substantially the same constitution as the semiconductor device 100 of the embodiment 1, the semiconductor device 100*d* of the embodiment 5 differs from the semiconductor device 100 of the embodiment 1 with respect to a point that the semiconductor device 100*d* includes a second gate lead line. That is, in the semiconductor device 100*d* of the embodiment 5, as shown in FIG. 11, the semiconductor device 100*d* also includes the second gate lead line 160 which extends from a gate pad forming region to a gate finger forming region on a side opposite to the gate pad forming region, and is formed over a drift layer 114 by way of a field oxide film 134.

The second lead line 160 is made of polysilicon containing an impurity at a predetermined concentration. The second gate lead line 160 has the same composition as gate electrode layers 124 and a gate lead line 136 and is formed by the same steps as the gate electrode layers 124 and the gate lead line 136.

In the semiconductor device 100*d* of the embodiment 5, the gate electrode layers 124 are formed at positions where the gate electrode layers 124 are in symmetry with respect to the second gate lead line 160 sandwiched therebetween in a state where the gate electrode layers 124 are arranged perpendicular to the second gate lead line 160. The gate electrode layers 124 are constituted of a plurality of gate electrode layers formed in a stripe shape.

The gate electrode layer 124 is formed such that a second resistor 162 is formed over one end of the gate electrode layer 124, and the resistor 144 is formed over the other end of the gate electrode layer 124. The gate electrode layer 124 is electrically connected to the second gate lead line 160 by way of the second resistor 162 at one end thereof, and is electrically connected to the gate lead line 136 by way of the resistor 144 at the other end thereof.

The second resistors 162 are made of polysilicon containing an impurity in the same manner as the resistors 144. A width of each second resistor 162 is set equal to a width of each gate electrode layer 124, and a length of each second resistor 162 is set equal to a length of each second resistor 162. The second resistor 162 has the same composition as the resistor 144 and is formed by the same steps as the resistor 144.

The semiconductor device 100*d* of the embodiment 5 is configured such that the longer a distance from the second resistor 162 to the gate finger 140 or the gate pad 142, the lower a resistance value of the second resistor 162 becomes. Accordingly, a resistance value of the second resistor closest to the gate finger 140 or the gate pad 142 (for example, the second resistor 162*a*) out of the respective second resistors 162 is set higher than a resistance value of the second resistor remotest from the gate finger 140 or the gate pad 142 (for example, the second resistor 162*b*) out of the respective second resistors 162.

To be more specific, the second resistor 162 is formed such that the longer a distance from the second resistor 162 to the gate finger 140 or the gate pad 142, the higher an impurity concentration in polysilicon which forms the second resistor 162 becomes. Accordingly, an impurity concentration in polysilicon for forming the second resistor closest to the gate finger 140 or the gate pad 142 (for example, the second resistor 162*a*) out of the respective second resistors 162 is set lower than an impurity concentration in polysilicon which forms the second resistor remotest from the gate finger 140 or the gate pad 142 (for example, the second resistor 162*b*) out of the respective second resistors 162.

A method of manufacturing a semiconductor device 100*d* of the embodiment 5 for manufacturing such a semiconductor device 100*d* basically has substantially the same steps as the method of manufacturing a semiconductor device of the embodiment 1, the method of manufacturing a semiconductor device 100*d* of the embodiment 5 differs from the method of manufacturing a semiconductor device of the embodiment 1 with respect to a point that a polysilicon layer having the same composition is formed in forming regions where the gate electrode layers 124, the gate lead line 136, the second gate lead line 160, the resistors 144 and the second resistors 162 are respectively formed in a polysilicon layer forming step; and an impurity is introduced into the polysilicon layers formed in the respective forming regions where the gate electrode layers 124, the gate lead line 136 and the second gate lead line 160 are formed out of the respective forming regions where the gate electrode layers 124, the gate lead line 136, the second gate lead line 160, the resistors 144 and the second resistor 162 are formed in second step of introducing an impurity.

In the second step of introducing an impurity, a mask is formed over regions other than forming regions where the gate electrode layers 124, the gate lead line 136 and the second gate lead line 160 are formed, and an n-type impurity is further introduced into a polysilicon layer by injecting an n-type impurity (for example, phosphorous ion) into a surface of the polysilicon layer by ion implantation.

In the second step of introducing an impurity, an n-type impurity (for example, phosphorous ion) is injected by ion implantation such that the longer a distance from the second resistor 162 to the gate finger 140 or the gate pad 142, the lower an impurity concentration in polysilicon which forms the second resistor 162 becomes. To be more specific, an n-type impurity (for example, phosphorous ion) is injected into a forming region where the second resistor 162 is formed by ion implantation after forming a mask such that the longer a distance to the gate finger 140 or the gate pad 142, the smaller a thickness of the mask becomes. The method of adjusting an impurity concentration in polysilicon can be carried out by an appropriate method besides ion implantation such as a method where the shorter the distance to the gate finger 140 or the gate pad 142, the larger the number of times of ion implantation becomes.

In this manner, although the semiconductor device 100*d* of the embodiment 5 differs from the semiconductor device 100 of the embodiment 1 with respect to a point that the semiconductor device 100*d* includes the second gate lead line, in the same manner as the semiconductor device 100 of the embodiment 1, an impurity concentration in polysilicon which forms the resistor 144 is lower than an impurity concentration in polysilicon which forms the gate electrode layer 124. Accordingly, when the resistor 144 is formed in steps of manufacturing the semiconductor device, it is possible to form the resistor 144 having a higher resistance value than the gate electrode layer 124 without forming the resistor 144 having a narrower width than the gate electrode layer 124. Accordingly, it is unnecessary to form the resistor 144 having a narrower width than the gate electrode layer 124 with high accuracy and hence, the variation in resistance values of the respective resistors 144 hardly occurs. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

According to the semiconductor device 100d of the embodiment 5, the impurity concentration in polysilicon which forms the second resistors 162 is lower than the impurity concentration in polysilicon which forms the gate electrode layers 124 and hence, in forming the second resistors 162 in steps of manufacturing the semiconductor device, it is possible to form the second resistors 162 having a higher resistance value than the gate electrode layers 124 without forming the second resistors 162 having a narrower width than the gate electrode layers 124. Accordingly, it is unnecessary to manufacture the second resistors 162 having a narrower width than the gate electrode layers 124 with high accuracy and hence, irregularities hardly occur in resistance values of the respective second resistors 162. As a result, it is possible to suppress a possibility that operation timings of the respective transistors vary, a possibility that a resistance of the resistor is excessively high so that an abnormal operation of the transistor occurs, or a possibility that a resistance of the second resistor is excessively high so that a capacitance of an electric current becomes small whereby seizure is liable to occur.

According to the semiconductor device 100d of the embodiment 5, the semiconductor device 100d includes the second gate lead line, and one end of the gate electrode layer 124 is electrically connected to the second gate lead line 160 by way of the second resistor 162, and the other end of the gate electrode layer 124 is electrically connected to the gate lead line 136 by way of the resistor 144. Accordingly, a length of each gate electrode layer 124 becomes short and hence, a polysilicon resistance of the gate electrode layer 124 can be lowered. Accordingly, the transistor easily operates in a stable manner thus providing a semiconductor device where operational timings of respective transistors which include the respective gate electrode layers 124 as constitutional elements can be easily controlled.

According to the semiconductor device 100d of the embodiment 5, with respect to the second resistors 162, a resistance value of the second resistor 162a closest to the gate finger 140 or the gate pad 142 is higher than a resistance value of the second resistor 162b remotest from the gate finger 140 or the gate pad 142 thus providing a semiconductor device where the respective gate resistances are equal. As a result, it is possible to set switching speeds of the respective cells equal thus providing a semiconductor device which can decrease the occurrence of noises.

According to the semiconductor device 100d of the embodiment 5, a width of the second resistor 162 is set equal to a width of the gate electrode layer 124 and hence, the resistance values of the second resistor 162 can be easily adjusted. As a result, irregularities in resistance values of the respective second resistors 162 hardly occur.

According to the semiconductor device 100d of the embodiment 5, with respect to the second resistors 162, an impurity concentration in polysilicon which forms the second resistor 162a closest to the gate finger 140 or the gate pad 142 is lower than an impurity concentration in polysilicon which forms the second resistor 162b remotest from the gate finger 140 or the gate pad 142 thus providing a semiconductor device where the respective gate resistances are equal. As a result, switching speeds of the respective cells can be set equal thus providing a semiconductor device which can decrease noises generated by high-speed switching.

According to method of manufacturing a semiconductor device of the embodiment 5, an impurity is introduced into the polysilicon layers in the respective forming regions where the gate electrode layers 124, the gate lead line 136 and the second gate lead line 160 are formed out of the forming regions where the gate electrode layers 124, the gate lead line 136, the second gate lead line 160, the resistors 144, and the second resistors 162 are formed and hence, it is possible to manufacture a semiconductor device having the above-mentioned advantageous effects.

According to the method of manufacturing a semiconductor device of the embodiment 5, the polysilicon layers having the same composition are formed over the forming regions where the gate electrode layers 124, the gate lead line 136, the second gate lead line 160, the resistors 144 and the second resistors 162 are formed, and an impurity is introduced into the polysilicon layers formed in the respective forming regions where the gate electrode layers 124, the gate lead line 136 and the second gate lead line 160 are formed out of the forming regions where the gate electrode layers 124, the gate lead line 136, the second gate lead line 160, the resistors 144 and the second resistors 162 are formed and hence, the gate electrode layers 124, the gate lead line 136, the resistors 144 and the second resistors 162 can be formed in parallel or simultaneously. Accordingly, compared to the case where the gate electrode layers 124, the gate lead line 136, the resistors 144 and the second resistors 162 are formed respectively, the number of steps can be decreased and hence, the semiconductor device can be manufactured with high productivity.

The semiconductor device 100d of the embodiment 5 has substantially the same constitution as the semiconductor device 100 of the embodiment 1 except for the point that the semiconductor device 100d includes the second gate lead line 160. Accordingly, out of the advantageous effects which the semiconductor device 100 of the embodiment 1 acquires, the semiconductor device 100d of the embodiment 5 acquires the same advantageous effects as the semiconductor device 100 of the embodiment 1 with respect to the constitutions of the semiconductor device 100d of the embodiment 5 substantially equal to the constitutions of the semiconductor device 100 of the embodiment 1.

[Embodiment 6]

Figure 12:
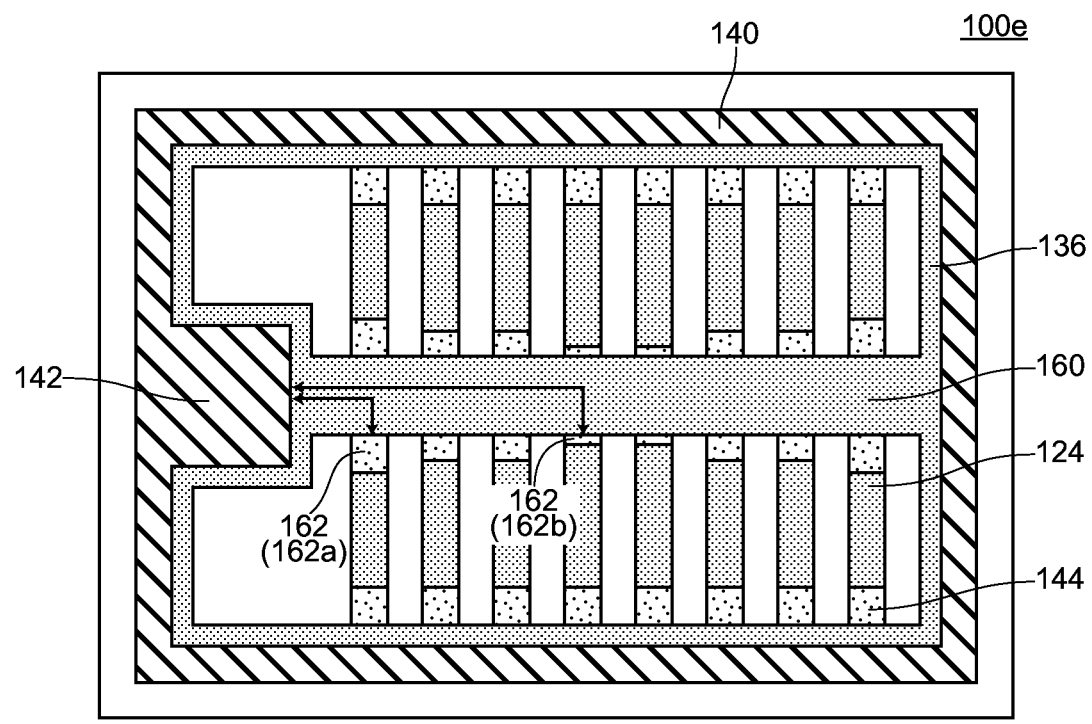
FIG. 12 is a plan view for explaining a semiconductor device 100e according to an embodiment 6.

FIG. 12 is a plan view for explaining a semiconductor device 100e according to an embodiment 6.

Although the semiconductor device 100e of the embodiment 6 basically has substantially the same constitution as the semiconductor device 100d of the embodiment 5, the semiconductor device 100e of the embodiment 6 differs from the semiconductor device 100d of the embodiment 5 with respect to a point that the respective resistors have different lengths. That is, in the semiconductor device 100e of the embodiment 6, as shown in FIG. 12, with respect to the second resistors 162, a length of the second resistor 162a closest to the gate finger 140 or the gate pad 142 is longer than a length of the second resistor 162b remotest from the gate finger 140 or the gate pad 142.

In the semiconductor device 100e of the embodiment 6, impurity concentrations of polysilicons which form the second resistors 162 are equal.

In this manner, although the semiconductor device 100e of the embodiment 6 differs from the semiconductor device 100d of the embodiment 5 with respect to a point that the respective resistors have different lengths, in the same manner as the semiconductor device 100d of the embodiment 5, an impurity concentration in polysilicon which forms the resistor 144 is lower than an impurity concentration in polysilicon which forms the gate electrode layer 124. Accordingly, when the resistor 144 is formed in steps of manufacturing the semiconductor device, it is possible to form the resistor 144 having a higher resistance value than the gate electrode layer 124 without forming the resistor 144 having a narrower width than the gate electrode layer 124. Accordingly, it is unnecessary to form the resistor 144 having a narrower width than the gate electrode layer 124 with high accuracy and hence, the variation in resistance values of the respective resistors 144 hardly occurs. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

The semiconductor device 100e of the embodiment 6 has substantially the same constitution as the semiconductor device 100d of the embodiment 5 except for the point that the respective resistors have different lengths. Accordingly, out of the advantageous effects which the semiconductor device 100d of the embodiment 5 acquires, the semiconductor device 100e of the embodiment 6 acquires the same advantageous effects as the semiconductor device 100d of the embodiment 5 with respect to the constitutions of the semiconductor device 100e of the embodiment 6 substantially equal to the constitutions of the semiconductor device 100d of the embodiment 5.

[Embodiment 7]

Figure 13:
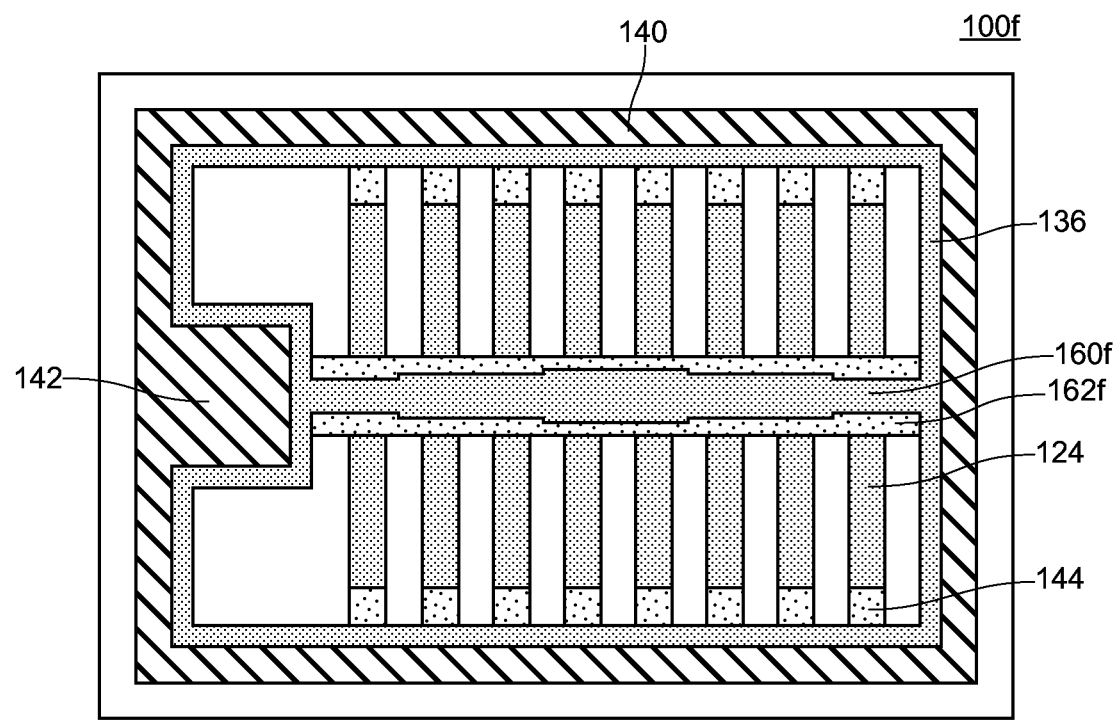
FIG. 13 is a plan view for explaining a semiconductor device 100f according to an embodiment 7.

FIG. 13 is a plan view for explaining a semiconductor device 100f according to an embodiment 7.

Although the semiconductor device 100f of the embodiment 7 basically has substantially the same constitution as the semiconductor device 100e of the embodiment 6, the semiconductor device 100f of the embodiment 7 differs from the semiconductor device 100e of the embodiment 6 with respect to a point that second resistors are formed in a region which extends from a gate pad forming region to a gate finger forming region on a side opposite to the gate pad forming region (hereinafter, referred to as "transverse region"). That is, in the semiconductor device 100f of the embodiment 7, as shown in FIG. 13, a second gate lead line 160f and second resistors 162f are formed in the transverse region.

The second resistors 162f are respectively formed along two sides of the transverse region which are in contact with gate electrode layers 124. The second resistor 162f is formed into an integral stepped shape where a length of a portion closest to the gate finger 140 or the gate pad 142 is the longest and a portion remotest from the gate finger 140 or the gate pad 142 is the shortest.

A width of the second gate lead line 160f is greater than a width of the gate electrode layer 124 and hence, when the second gate lead line 160f is formed, it is possible to form the second gate lead line 160f with high accuracy, and variation in widths of the second gate lead lines 160f hardly occurs. Accordingly, irregularities in resistance values of the second gate lead lines 160f hardly occur.

In this manner, although the semiconductor device 100f of the embodiment 7 differs from the semiconductor device 100e of the embodiment 6 with respect to a point that the second resistors are formed in the transverse region, in the same manner as the semiconductor device 100e of the embodiment 6, an impurity concentration in polysilicon which forms the resistor 144 is lower than an impurity concentration in polysilicon which forms the gate electrode layer 124. Accordingly, when the resistor 144 is formed in steps of manufacturing the semiconductor device, it is possible to form the resistor 144 having a higher resistance value than the gate electrode layer 124 without forming the resistor 144 having a narrower width than the gate electrode layer 124. Accordingly, it is unnecessary to form the resistor 144 having a narrower width than the gate electrode layer 124 with high accuracy and hence, the variation in resistance values of the respective resistors 144 hardly occurs. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

Further, according to the semiconductor device 100f of the embodiment 7, the second resistors 162 are formed in the transverse region and hence, it is possible to widen a region which is used as a cell in the cell region. As a result, a semiconductor device having a low ON resistance can be realized.

The semiconductor device 100f of the embodiment 7 has substantially the same constitution as the semiconductor device 100e of the embodiment 6 except for the point that the second resistors are formed in the transverse region. Accordingly, out of the advantageous effects which the semiconductor device 100e of the embodiment 6 acquires, the semiconductor device 100f of the embodiment 7 acquires the same advantageous effects as the semiconductor device 100e of the embodiment 6 with respect to the constitutions of the semiconductor device 100f of the embodiment 7 substantially equal to the constitutions of the semiconductor device 100e of the embodiment 6.

[Embodiment 8]

Figure 14:
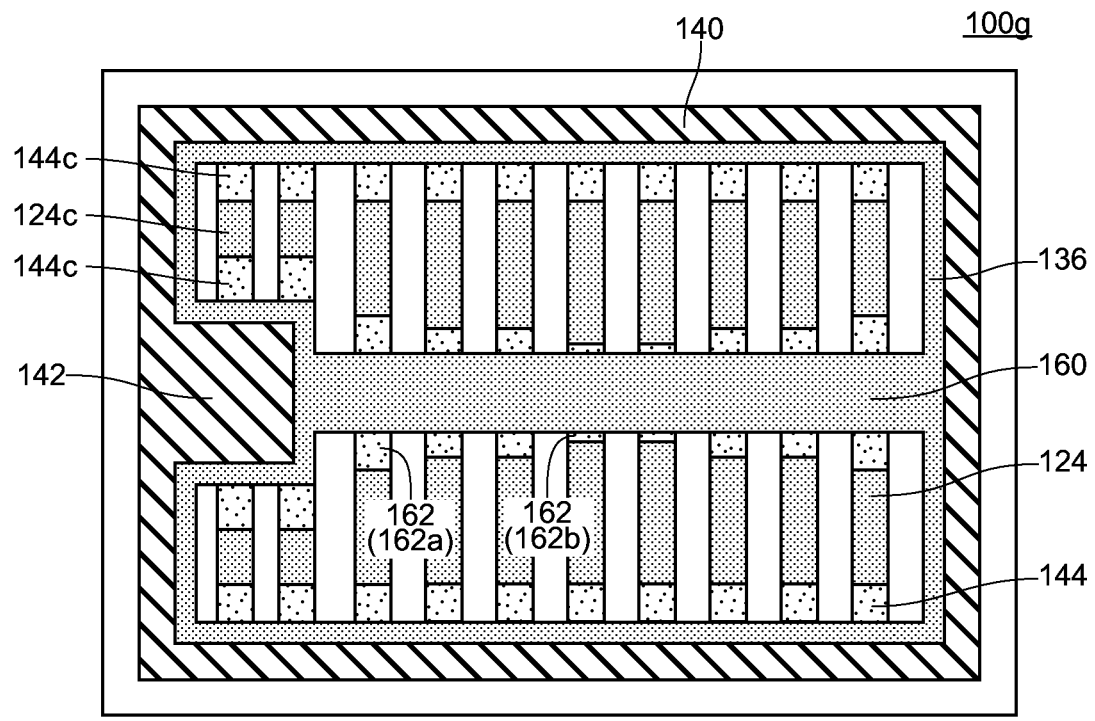
FIG. 14 is a plan view for explaining a semiconductor device 100g according to an embodiment 8.

FIG. 14 is a plan view for explaining a semiconductor device 100g according to an embodiment 8.

Although the semiconductor device 100g of the embodiment 8 basically has substantially the same constitution as the semiconductor device 100d of the embodiment 5, the semiconductor device 100g of the embodiment 8 differs from the semiconductor device 100d of the embodiment 5 with respect to a point that gate electrode layers are also formed between a gate pad forming region and a gate finger forming region. That is, in the semiconductor device 100g of the embodiment 8, as shown in FIG. 14, gate electrode layers 124c which are respectively connected to a gate lead line in a gate pad forming region and to a gate lead line in a gate finger forming region by way of resistors 144c are formed.

Two pairs of gate electrode layers 124c each consisting of two gate electrode layers 124c are also formed in the direction perpendicular to the direction that the gate pad forming region projects into a cell region. The gate electrode layers 124c are arranged parallel to a plurality of gate electrode layers 124 respectively. A length of the gate electrode layer 124c is set shorter than a length of each gate electrode layer. Accordingly, a polysilicon resistance of the gate electrode layer 124c becomes lower than a polysilicon resistance of each gate electrode layer. Accordingly, a resistance value of the resistor 144c is adjusted so that the resistance value becomes equal to each gate resistance of the gate electrode layer 124 by setting a length of the resistor 144c longer than a length of any one of the resistors 144 or a length of any one of the second resistors 162.

In this manner, although the semiconductor device 100g of the embodiment 8 differs from the semiconductor device 100d of the embodiment 5 with respect to a point that the gate electrode layers are also formed between the gate pad forming region and the gate finger forming region, in the same manner as the semiconductor device 100d of the embodiment 5, an impurity concentration in polysilicon which forms the resistors 144, 144c is lower than an impurity concentration in polysilicon which forms the gate electrode layers 124, 124c. Accordingly, when the resistors 144, 144c are formed in steps of manufacturing the semiconductor device, it is possible to form the resistors 144, 144c having a higher resistance value than the gate electrode layers 124, 124c without forming the resistors 144, 144c having a narrower width than the gate electrode layers 124, 124c. Accordingly, it is unnecessary to form the resistors 144, 144c having a narrower width than the gate electrode layers 124, 124c with high accuracy and hence, the variation in resistance values of the respective resistors 144, 144c hardly occurs. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

The semiconductor device 100g of the embodiment 8 has substantially the same constitution as the semiconductor device 100d of the embodiment 5 except for the point that the gate electrode layers are also formed between the gate pad forming region and the gate finger forming region. Accordingly, out of the advantageous effects which the semiconductor device 100d of the embodiment 5 acquires, the semiconductor device 100g of the embodiment 8 acquires the same advantageous effects as the semiconductor device 100d of the embodiment 5 with respect to the constitutions of the semiconductor device 100g of the embodiment 8 substantially equal to the constitutions of the semiconductor device 100d of the embodiment 5.

[Embodiment 9]

Figure 15:
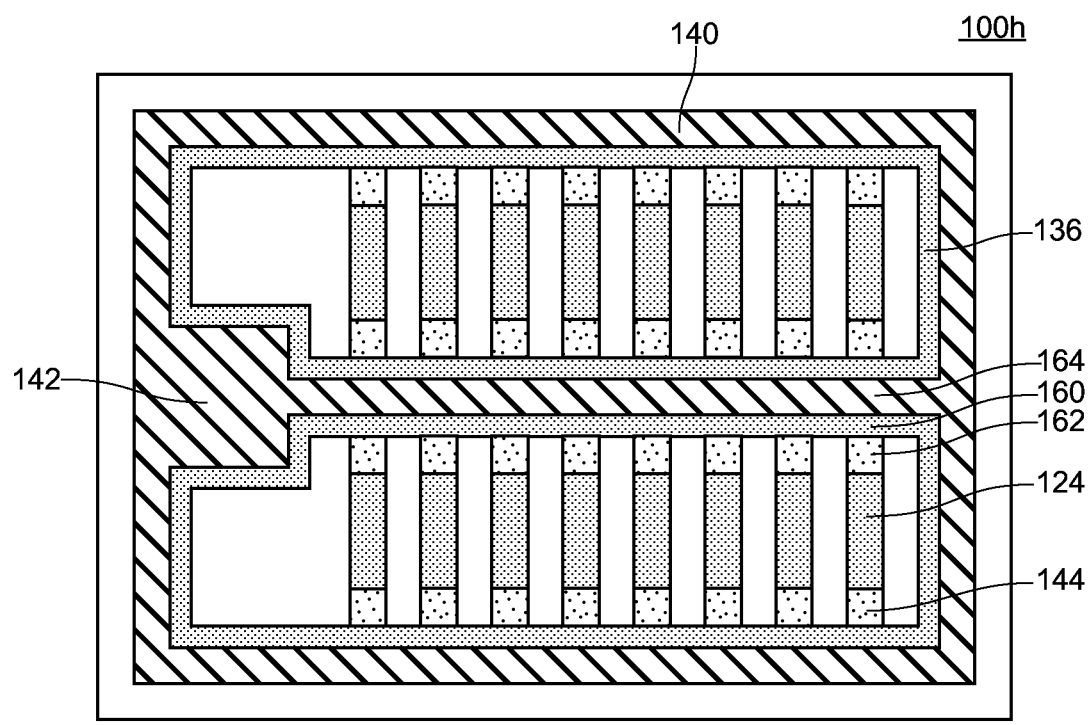
FIG. 15 is a plan view for explaining a semiconductor device 100h according to an embodiment 9.

FIG. 15 is a plan view for explaining a semiconductor device 100h according to an embodiment 9.

Although the semiconductor device 100h of the embodiment 9 basically has substantially the same constitution as the semiconductor device 100d of the embodiment 5, the semiconductor device 100h of the embodiment 9 differs from the semiconductor device 100d of the embodiment 5 with respect to a point that the semiconductor device 100h includes a second gate finger. That is, in the semiconductor device 100h of the embodiment 9, as shown in FIG. 15, the semiconductor device 100h includes a second gate finger 164 which is made of metal, is formed over a second gate lead line 160, and is connected to a gate finger 140 and a gate pad 142.

The second gate finger 164 is formed over the second gate lead line 160 without being interrupted and hence, distances from respective second resistors 162 to the second gate finger 164 become equal. Accordingly, by setting a resistance value of the resistors 144 and a resistance value of the second resistors 162 equal, gate resistances of the respective gate electrode layers 124 can be made equal. To be more specific, the resistors 144 and the second resistors 162 are formed such that a length of the resistor 144 and a length of the second resistor 162 are equal, and an impurity concentration in polysilicon for forming the resistor 144 and an impurity concentration in polysilicon for forming the second resistor 162 are set equal.

In the semiconductor device 100h of embodiment 9, source regions are separated from each other. Accordingly, by connecting the respective source regions to each other by wire bonding or the like, the source regions can have the same potential.

In this manner, although the semiconductor device 100h of the embodiment 9 differs from the semiconductor device 100d of the embodiment 5 with respect to a point that the semiconductor device 100h includes the second gate finger, in the same manner as the semiconductor device 100d of the embodiment 5, an impurity concentration in polysilicon which forms the resistor 144 is lower than an impurity concentration in polysilicon which forms the gate electrode layer 124. Accordingly, when the resistor 144 is formed in steps of manufacturing the semiconductor device, it is possible to form the resistor 144 having a higher resistance value than the gate electrode layer 124 without forming the resistor 144 having a narrower width than the gate electrode layer 124. Accordingly, it is unnecessary to form the resistor 144 having a narrower width than the gate electrode layer 124 with high accuracy and hence, the variation in resistance values of the respective resistors 144 hardly occurs. As a result, it is possible to suppress a possibility that operation timings of respective transistors vary, a possibility that a resistance of the resistor is excessively high so that an abnormal operation of the transistor occurs, or a possibility that a capacitance of an electric current becomes small due to an excessively high resistance of a resistor so that seizure is liable to occur.

Further, according to the semiconductor device 100h of the embodiment 9, the second gate finger 164 is made of metal having an extremely low resistance value compared to polysilicon, and distances from the respective second resistors 162 to the second gate finger 164 are equal and hence, irregularities in respective gate resistances hardly occur. As a result, it is possible to more effectively suppress a possibility that operation timings of respective transistors vary, a possibility that a resistance of the resistor is excessively high so that an abnormal operation of the transistor occurs, or a possibility that the resistance of the resistor is excessively high so that a capacitance of an electric current becomes small whereby seizure is liable to occur.

The semiconductor device 100h of the embodiment 9 has substantially the same constitution as the semiconductor device 100d of the embodiment 5 except for the point that the semiconductor device 100h includes the second gate finger. Accordingly, out of the advantageous effects which the semiconductor device 100d of the embodiment 5 acquires, the semiconductor device 100h of the embodiment 9 acquires the same advantageous effects as the semiconductor device 100d of the embodiment 5 with respect to the constitutions of the semiconductor device 100h of the embodiment 9 substantially equal to the constitutions of the semiconductor device 100d of the embodiment 5.

[Embodiment 10]

Figure 16:
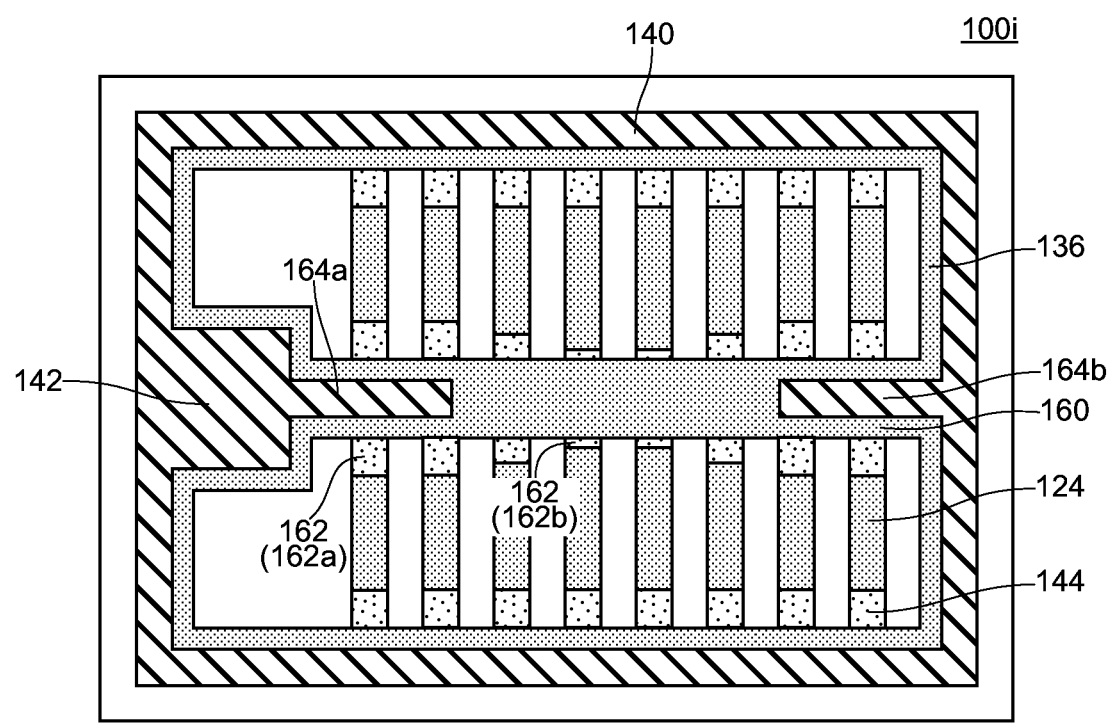
FIG. 16 is a plan view for explaining a semiconductor device 100i according to an embodiment 10.

FIG. 16 is a plan view for explaining a semiconductor device 100i according to an embodiment 10.

Although the semiconductor device 100i of the embodiment 10 basically has substantially the same constitution as the semiconductor device 100h of the embodiment 9, the semiconductor device 100i of the embodiment 10 differs from the semiconductor device 100h of the embodiment 9 with respect to a point that the constitution of a second gate finger differs from the constitution of the corresponding second gate finger in the semiconductor device 100h of the embodiment 9. That is, in the semiconductor device 100i of the embodiment 10, as shown in FIG. 16, the second gate finger is divided into a second gate finger 164a which extends from a gate pad 142 side and a second gate finger 164b which extends from a gate finger 140 side.

In the semiconductor device 100i of the embodiment 10, the longer the distance from each second resistor 162 to the second gate finger (second gate finger 164a or the second gate finger 164b), the lower a resistance value of each second resistor 162 becomes. Accordingly, with respect to the respective second resistors 162, a resistance value of the second resistor 162a closest to the second gate finger is higher than a resistance value of the second resistor 162b remotest from the second gate finger.

To be more specific, the longer a distance from each second resistor 162 to the second gate finger (second gate finger 164a or the second gate finger 164b), the shorter a length of each second resistor 162 becomes. Accordingly, with respect to the respective second resistors 162, the length of the second resistor 162a closest to the second gate finger is greater than the length of the second resistor 162b remotest from the second gate finger.

In this manner, the semiconductor device 100i of the embodiment 10 differs from the semiconductor device 100h of the embodiment 9 with respect to the constitution of the second gate finger. However, in the same manner as the semiconductor device 100h of the embodiment 9, the impurity concentration in polysilicon which forms the resistors 144 is lower than the impurity concentration in polysilicon which forms the gate electrode layer 124 and hence, in forming the resistors 144 in steps of manufacturing the semiconductor device, it is possible to form the resistors 144 having a higher resistance value than the gate electrode layers 124 without forming the resistors having a narrower width than the gate electrode layers 124. Accordingly, it is unnecessary to manufacture the resistors 144 having a narrower width than the gate electrode layers 124 with high accuracy and hence, irregularities hardly occur in resistance values of the respective resistors 144. As a result, it is possible to suppress a possibility that operation timings of the respective transistors vary, a possibility that a resistance of the resistor is excessively high so that an abnormal operation of the transistor occurs, or a possibility that a resistance of the resistor is excessively high so that a capacitance of an electric current becomes small whereby seizure is liable to occur.

The semiconductor device 100i of the embodiment 10 has substantially the same constitution as the semiconductor device 100h of the embodiment 9 except for the constitution of the second gate finger. Accordingly, out of the advantageous effects which the semiconductor device 100h of the embodiment 9 acquires, the semiconductor device 100i of the embodiment 10 acquires the same advantageous effects as the semiconductor device 100h of the embodiment 9 with respect to the constitutions of the semiconductor device 100i of the embodiment 10 substantially equal to the constitutions of the semiconductor device 100h of the embodiment 9.

[Embodiments 11 and 12]

Figure 17A:
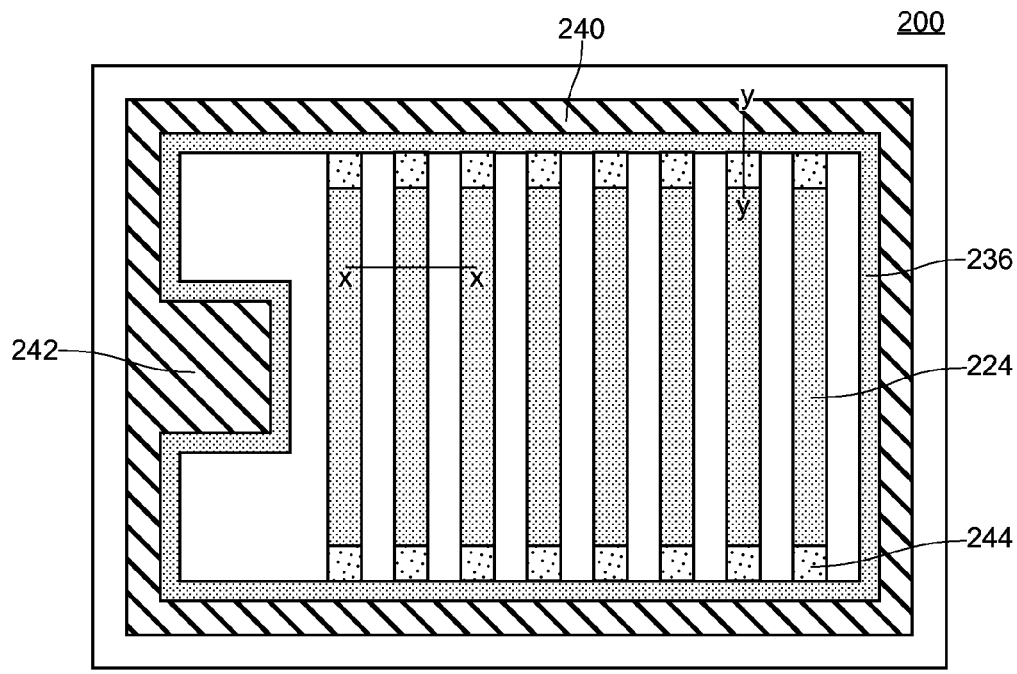
FIG. 17A to 17C are views for explaining a semiconductor device 200 according to an embodiment 11.
Figure 17B:
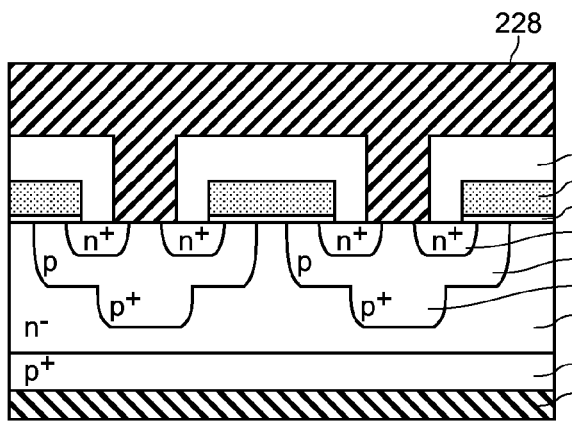
Figure 17C:
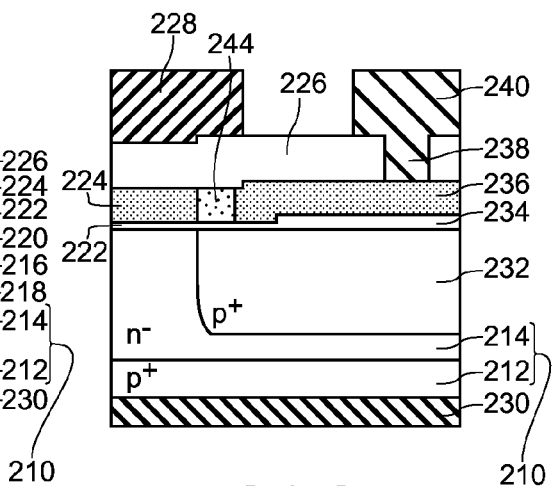

FIG. 17A to FIG. 17C are views for explaining a semiconductor device 200 of an embodiment 11. FIG. 17A is a plan view of the semiconductor device 200, FIG. 17B is a cross-sectional view taken along a line x-x in FIG. 17A, and FIG. 17C is a cross-sectional view taken along a line y-y in FIG. 17A. FIG. 18A to FIG. 18C are views for explaining a semiconductor device 200a of an embodiment 12. FIG. 18A is a plan view of the semiconductor device 200a, FIG. 18B is a cross-sectional view taken along a line x-x in FIG. 18A, and FIG. 18C is a cross-sectional view taken along a line y-y in FIG. 18A. In FIG. 17A and FIG. 18A, an interlayer insulation layer 226 and an emitter electrode layer 228 are not shown in the drawing. In FIG. 18, symbol 233 indicates a p-type diffusion region.

Although the semiconductor device 200 of the embodiment 11 and the semiconductor device 200a of the embodiment 12 basically have substantially the same constitution as the semiconductor device 100 of the embodiment 1, the semiconductor device 200 of the embodiment 11 and the semiconductor device 200a of the embodiment 12 differ from the semiconductor device 100 of the embodiment 1 with respect to a point that the semiconductor device 200 and the semiconductor device 200a are formed of an IGBT. That is, the semiconductor device 200 of the embodiment 11 is a planar-type IGBT as shown in FIG. 17A to FIG. 17C, and the semiconductor device 200a of the embodiment 12 is a trench-type IGBT as shown in FIG. 18A to FIG. 18C.

In this manner, the semiconductor device 200 of the embodiment 11 and the semiconductor device 200a of the embodiment 12 differ from the semiconductor device 100 of the embodiment 1 with respect to a point that the semiconductor devices 200, 200a are formed of the IGBT. However, in the same manner as the semiconductor device 100 of the embodiment 1, the impurity concentration in polysilicon which forms the resistors 244 is lower than the impurity concentration in polysilicon which forms the gate electrode layer 224 and hence, in forming the resistors 244 in steps of manufacturing the semiconductor device, it is possible to form the resistors 244 having a higher resistance value than the gate electrode layers 224 without forming the resistors having a narrower width than the gate electrode layers 224. Accordingly, it is unnecessary to manufacture the resistors having a narrower width than the gate electrode layers 224 with high accuracy and hence, irregularities hardly occur in resistance values of the respective resistors 244. As a result, it is possible to suppress a possibility that operation timings of the respective transistors vary, a possibility that a resistance of the resistor is excessively high so that an abnormal operation of the transistor occurs, or a possibility that a resistance of the resistor is excessively high so that a capacitance of an electric current becomes small whereby seizure is liable to occur.

The semiconductor device 200 of the embodiment 11 and the semiconductor device 200a of the embodiment 12 have substantially the same constitution as the semiconductor device 100 of the embodiment 1 except for the point that the semiconductor devices 200, 200a are formed of the IGBT. Accordingly, out of the advantageous effects which the semiconductor device 100 of the embodiment 1 acquires, the semiconductor device 200 of the embodiment 11 and the semiconductor device 200a of the embodiment 12 acquire the same advantageous effects as the semiconductor device 100 of the embodiment 1 with respect to the constitutions of the semiconductor device 200 of the embodiment 11 and the constitutions of the semiconductor device 200a of the embodiment 12 substantially equal to the constitutions of the semiconductor device 100 of the embodiment 1.

[Test Example]

The test example is performed for clarifying that the semiconductor device of the present invention can decrease noises generated by high-speed switching.

Figure 19:
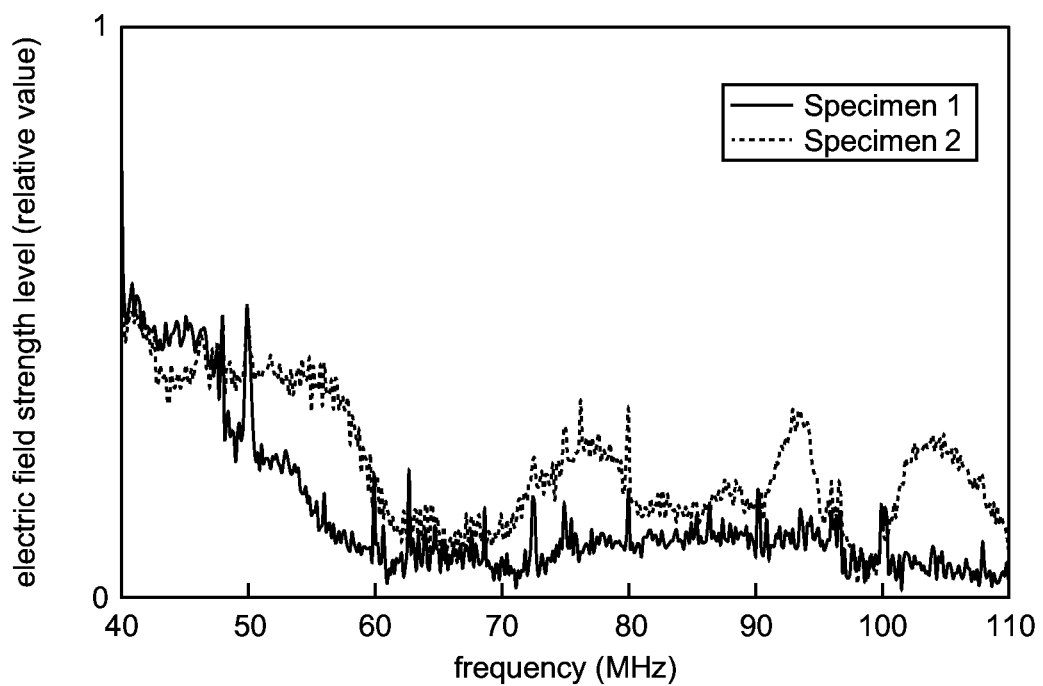
FIG. 19 is a graph showing a result of test examples.
Figure 20A:
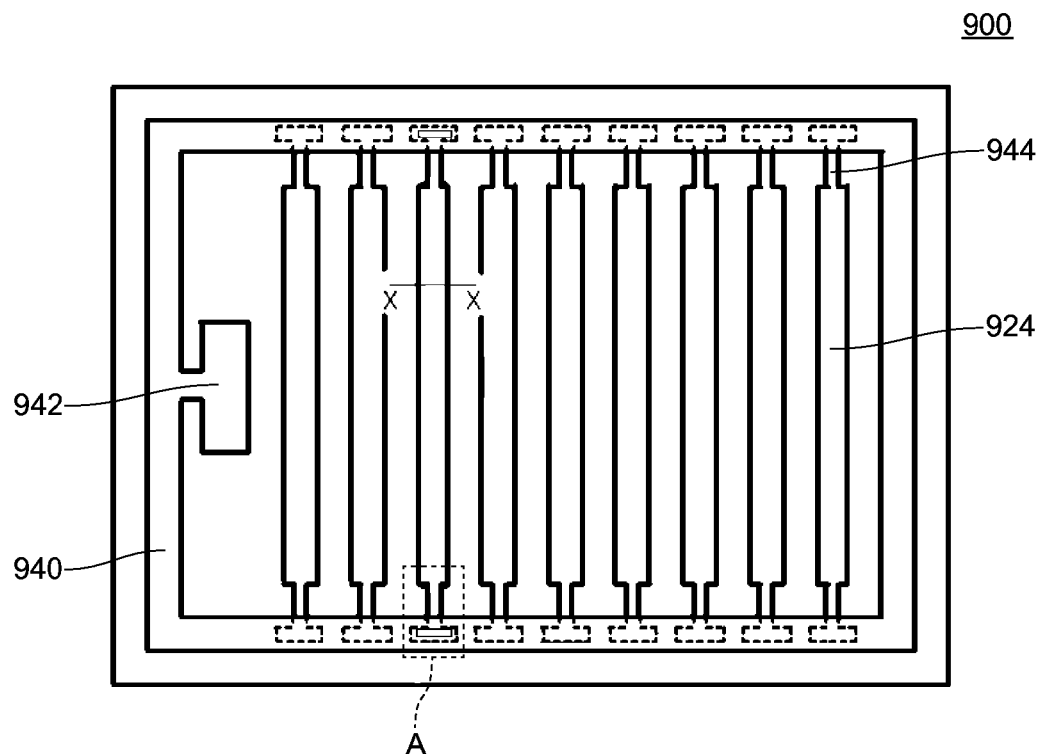
FIG. 20A to 20C are views for explaining a conventional semiconductor device 900.
Figure 20B:
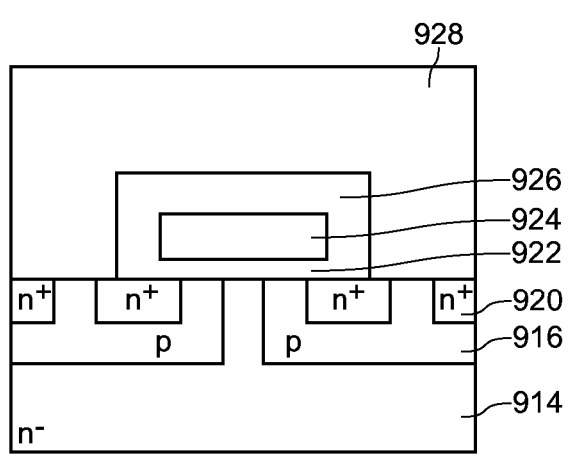
Figure 20C:
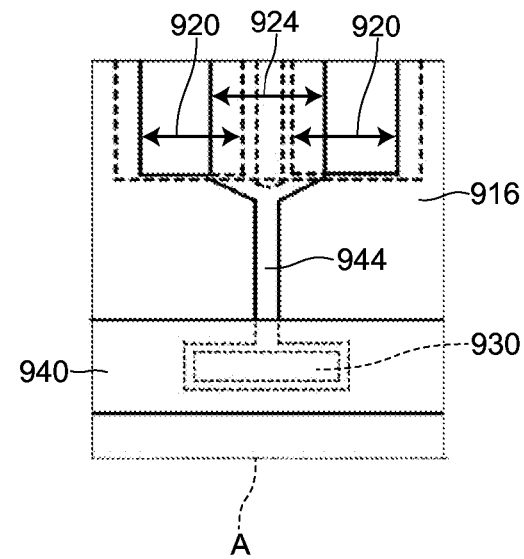

FIG. 19 is a graph showing a result of the test example. In FIG. 19, a value of an electric field strength level is a logarithmic value.

1. Preparation of Specimens (1) Specimen 1 (Example)

A semiconductor device having the same constitution as the semiconductor device 100 of the embodiment 1 is mounted on a switching power source, and the structure is used as the specimen 1.

(2) Specimen 2 (comparison example)

A semiconductor device where gate electrode layers and a gate lead line are electrically connected with each other without via resistors is mounted on a switching power source, and the structure is used as the specimen 2.

2. Method of Testing

The test is carried out such that the above-mentioned specimen 1 and specimen 2 are respectively turned on with an input voltage of 245 V respectively, and electric field strength levels of noises generated by such switching are measured using a noise measurement device. A frequency band of measured noises falls within a range of 40 MHz to 110 MHz.

3. Result of Test

The result of measurement is shown in FIG. 19. It is understood also from the result shown in FIG. 19 that the electric field strength level of the specimen 1 is lower than the electric field strength level of the specimen 2. From this result, it has become apparent that the semiconductor device of the present invention can decrease noises generated by high-speed switching.

Although the present invention has been explained based on the above-mentioned embodiments, the present invention is not limited to the above-mentioned embodiments. The present invention can be carried out in various modes without departing from the gist of the present invention, and the following modifications are conceivable, for example.

(1) The number, materials and shapes of the respective constitutional elements described in the above-mentioned embodiments and drawings are exemplified only as examples, and can be modified within a range where advantageous effects of the present invention are not impaired.

(2) In the above-mentioned respective embodiments, the present invention has been explained by taking the case where an impurity is introduced after forming the polysilicon layer in the first impurity introducing step as an example. However, the present invention is not limited to such a case. For example, the present invention is also applicable to the case where polysilicon which contains an impurity in advance is formed.

(3) In the above-mentioned respective embodiments, the explanation has been made with respect to the case where an impurity is introduced by ion implantation after the polysilicon layer is formed in the first impurity introducing step. However, the present invention is not limited to such a case. For example, the present invention is also applicable to the case where an impurity is introduced by deposition.

(4) In the above-mentioned embodiments 1, 2, 4 to 6 and 8 to 12, the present invention has been explained by taking the case where a width of the gate electrode layer 124 and a width of the resistor 144 are equal as an example. However, the present invention is not limited to such a case. For example, the present invention is also applicable to the case where a width of the resistor is larger than a width of the gate electrode layer.

(5) In the above-mentioned respective embodiments, the present invention has been explained by taking the case where the gate finger 140 and the gate pad 142 are formed over the gate lead line 136 byway of the gate insulation layer 122 as an example. However, the present invention is not limited to such a case. For example, the present invention is also applicable to the case where the gate finger 140 or/and the gate pad 142 is/are directly formed over the gate lead line 136.

(6) In the above-mentioned respective embodiments, the present invention has been explained by taking the case where the gate finger (or the second gate finger) is made of metal as an example. However, the present invention is not limited to such a case. For example, the present invention is also applicable to a case where the gate finger (or the second gate finger) is formed using a conductor such as polysilicon. When an internal resistance of the conductor is high, it is preferable to change lengths or impurity concentrations of the resistors 144 (and the second resistors 162) for setting gate resistances equal.

(7) In the above-mentioned embodiments 4 and 8, the present invention has been explained by taking the case where lengths of the resistors 144c are adjusted as an example. However, the present invention is not limited to such a case. For example, the present invention is also applicable to the case where impurity concentrations in the resistors 144c are adjusted.

What is claimed is:

1. A semiconductor device comprising:
   a cell region which is defined on a semiconductor substrate on which a low resistance semiconductor layer of a first-conductive type or a second-conductive type and a drift layer of a first-conductive type are laminated; and
   a peripheral region which includes a gate finger forming region which surrounds the cell region, and a gate pad forming region which projects into the cell region, wherein
   the semiconductor device further comprises, in the cell region:
   the low resistance semiconductor layer;
   the drift layer of a first-conductive type which is formed over the low resistance semiconductor layer;
   a base region of a second-conductive type which is formed over a surface of the drift layer;
   a high-concentration semiconductor region of a first-conductive type which is formed within the base region; and
   a gate electrode layer which is made of polysilicon containing an impurity at a predetermined concentration,
   the semiconductor device further comprises in the peripheral region:
   the low resistance semiconductor layer;
   the drift layer which is formed over the low resistance semiconductor layer;
   a gate lead line which is made of polysilicon, and is formed in the gate finger forming region and the gate pad forming region over the drift layer by way of a field oxide film;
   a gate finger which is made of metal, and is formed over the gate lead line in the gate finger forming region; and
   a gate pad which is made of metal, is formed over the gate lead line in the gate pad forming region, and is connected to the gate finger,
   the gate electrode layer and the gate lead line are electrically connected with each other by way of a resistor made of polysilicon containing an impurity,
   an impurity concentration in polysilicon which forms the resistor is lower than an impurity concentration in polysilicon which forms the gate electrode layer, and
   a width of the resistor is equal to a width of the gate electrode layer.

2. The semiconductor device according to claim 1, wherein the gate electrode layer is constituted of a plurality of gate electrode layers formed in a stripe shape.

3. The semiconductor device according to claim 1, further comprising: a second gate lead line which is made of polysilicon containing an impurity at a predetermined concentration, extends from the gate pad forming region to the gate finger forming region on a side opposite to the gate pad forming region, and is formed over the drift layer by way of a field oxide film, and
   the gate electrode layer and the second gate lead line are electrically connected with each other by way of a second resistor which is made of polysilicon containing an impurity, and
   an impurity concentration in polysilicon which forms the second resistor is lower than an impurity concentration in polysilicon which forms the gate electrode layer.

4. The semiconductor device according to claim 3, wherein the gate electrode layer is constituted of a plurality of gate electrode layers formed in a stripe shape,
   the second resistor is formed over one end of each gate electrode layer, and
   a resistance value of the second resistor closest to the gate finger or the gate pad out of the respective second resistors is higher than a resistance value of the second resistor remotest from the gate finger or the gate pad out of the respective second resistors.

5. The semiconductor device according to claim 4, wherein a length of the second resistor closest to the gate finger or the gate pad out of the respective second resistors is larger than a length of the second resistor remotest from the gate finger or the gate pad out of the respective second resistors.

6. The semiconductor device according to claim 4, wherein an impurity concentration in polysilicon which forms the second resistor closest to the gate finger or the gate pad out of the respective second resistors is lower than an impurity concentration in polysilicon which forms the second resistor remotest from the gate finger or the gate pad out of the respective second resistors.

7. The semiconductor device according to claim 3, further comprising a second gate finger which is made of metal, is formed over the second gate lead line, and is connected to the gate finger and the gate pad.

8. The semiconductor device according to claim 3, wherein a width of the second resistor is equal to a width of the gate electrode layer.

9. The semiconductor device according to claim 1, wherein the resistor is formed over the peripheral region.

10. The semiconductor device according to claim 1, wherein the resistor is formed over the cell region.

11. The semiconductor device according to claim 1, wherein in the cell region,
   the high-concentration semiconductor region is formed over a surface of the base region, and
   the gate electrode layer is formed over the base region sandwiched between the drift layer and the high-concentration semiconductor region by way of a gate insulation layer.

12. The semiconductor device according to claim 1, wherein in the cell region,
   the semiconductor device further comprises a plurality of trenches which are formed in the base region such that the trenches reach the drift layer,
   the high-concentration semiconductor region is formed such that at least a portion of the high-concentration semiconductor region is exposed on inner peripheral surfaces of the trenches, and
   the gate electrode layer is embedded in the inside of trenches by way of a gate insulation layer formed over the inner peripheral surfaces of the trenches.

13. A semiconductor device comprising:
   a cell region which is defined on a semiconductor substrate on which a low resistance semiconductor layer of a first-conductive type or a second-conductive type and a drift layer of a first-conductive type are laminated; and
   a peripheral region which includes a gate finger forming region which surrounds the cell region, and a gate pad forming region which projects into the cell region, wherein
   the semiconductor device further comprises, in the cell region:
   the low resistance semiconductor layer;
   the drift layer of a first-conductive type which is formed over the low resistance semiconductor layer;
   a base region of a second-conductive type which is formed over a surface of the drift layer;
   a high-concentration semiconductor region of a first-conductive type which is formed within the base region; and
   a gate electrode layer which is made of polysilicon containing an impurity at a predetermined concentration,
   the semiconductor device further comprises in the peripheral region:
   the low resistance semiconductor layer;
   the drift layer which is formed over the low resistance semiconductor layer;
   a gate lead line which is made of polysilicon, and is formed in the gate finger forming region and the gate pad forming region over the drift layer by way of a field oxide film,
   a gate finger which is made of metal, and is formed over the gate lead line in the gate finger forming region;
   a gate pad which is made of metal, is formed over the gate lead line in the gate pad forming region, and is connected to the gate finger; and
   a second gate lead line which is made of polysilicon containing an impurity at a predetermined concentration, extends from the gate pad forming region to the gate finger forming region on a side opposite to the gate pad forming region, and is formed over the drift layer by way of a field oxide film,
   the gate electrode layer and the gate lead line are electrically connected with each other by way of a resistor made of polysilicon containing an impurity,
   the gate electrode layer and the second gate lead line are electrically connected with each other by way of a second resistor which is made of polysilicon containing an impurity,
   an impurity concentration in polysilicon which forms the resistor is lower than an impurity concentration in polysilicon which forms the gate electrode layer,
   an impurity concentration in polysilicon which forms the second resistor is lower than an impurity concentration in polysilicon which forms the gate electrode layer, and
   a width of the second resistor is equal to a width of the gate electrode layer.

14. A semiconductor device comprising:
   a cell region which is defined on a semiconductor substrate on which a low resistance semiconductor layer of a first-conductive type or a second-conductive type and a drift layer of a first-conductive type are laminated; and
   a peripheral region which includes a gate finger forming region which surrounds the cell region, and a gate pad forming region which projects into the cell region, wherein
   the semiconductor device further comprises, in the cell region:
   the low resistance semiconductor layer;
   the drift layer of a first-conductive type which is formed over the low resistance semiconductor layer;
   a base region of a second-conductive type which is formed over a surface of the drift layer;
   a high-concentration semiconductor region of a first-conductive type which is formed within the base region; and
   a gate electrode layer which is made of polysilicon containing an impurity at a predetermined concentration and is constituted of a plurality of gate electrode layers formed in a stripe shape,
   the semiconductor device further comprises in the peripheral region:
   the low resistance semiconductor layer;
   the drift layer which is formed over the low resistance semiconductor layer;
   a gate lead line which is made of polysilicon, and is formed in the gate finger forming region and the gate pad forming region over the drift layer by way of a field oxide film;

a gate finger which is made of metal, and is formed over the gate lead line in the gate finger forming region; and a gate pad which is made of metal, is formed over the gate lead line in the gate pad forming region, and is connected to the gate finger, and a second gate lead line which is made of polysilicon containing an impurity at a predetermined concentration, extends from the gate pad forming region to the gate finger forming region on a side opposite to the gate pad forming region, and is formed over the drift layer by way of a field oxide film, the gate electrode layer and the gate lead line are electrically connected with each other by way of a resistor made of polysilicon containing an impurity, the gate electrode layer and the second gate lead line are electrically connected with each other by way of a second resistor which is made of polysilicon containing an impurity, the second resistor is formed over one end of each gate electrode layer, an impurity concentration in polysilicon which forms the resistor is lower than an impurity concentration in polysilicon which forms the gate electrode layer, an impurity concentration in polysilicon which forms the second resistor is lower than an impurity concentration in polysilicon which forms the gate electrode layer, and a resistance value of the second resistor closest to the gate finger or the gate pad out of the respective second resistors is higher than a resistance value of the second resistor remotest from the gate finger or the gate pad out of the respective second resistors.

15. The semiconductor device according to claim 14, wherein a length of the second resistor closest to the gate finger or the gate pad out of the respective second resistors is larger than a length of the second resistor remotest from the gate finger or the gate pad out of the respective second resistors.

* * * * *